(12) United States Patent
Kim et al.

(10) Patent No.: US 8,916,878 B2
(45) Date of Patent: Dec. 23, 2014

(54) THIN FILM TRANSISTOR AND ORGANIC LIGHT-EMITTING DISPLAY APPARATUS

(71) Applicant: Samsung Display Co., Ltd., Yongin, Gyeonggi-Do (KR)

(72) Inventors: Jung-Bae Kim, Yongin (KR); Yong-Sung Park, Yongin (KR); Wang-Jo Lee, Yongin (KR); Hae-Yeon Lee, Yongin (KR); Keum-Nam Kim, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 13/797,670

(22) Filed: Mar. 12, 2013

(65) Prior Publication Data

US 2014/0077173 A1   Mar. 20, 2014

(30) Foreign Application Priority Data

Sep. 19, 2012   (KR) .......................... 10-2012-0104213

(51) Int. Cl.
  *G09G 3/32*   (2006.01)
  *H01L 27/12*   (2006.01)
  *H01L 29/786*   (2006.01)
  *H01L 51/52*   (2006.01)
  *H01L 27/32*   (2006.01)

(52) U.S. Cl.
  CPC .............. *H01L 51/52* (2013.01); *H01L 27/124* (2013.01); *H01L 29/786* (2013.01); *H01L 27/3262* (2013.01)

USPC .............................................. 257/59; 257/40

(58) Field of Classification Search
  CPC ....................... G09G 3/3233; G09G 2300/042
  USPC ................................................ 257/59, 40.59
  See application file for complete search history.

(56) References Cited

U.S. PATENT DOCUMENTS

| 2001/0017372 A1* | 8/2001 | Koyama ......................... 257/72 |
| 2010/0136775 A1* | 6/2010 | Choi et al. .................... 438/585 |
| 2011/0220888 A1 | 9/2011 | Choi et al. |

FOREIGN PATENT DOCUMENTS

| KR | 10-0579182 | 5/2006 |
| KR | 10-2008-0001911 A | 1/2008 |
| KR | 10-2008-0099484 A | 11/2008 |
| KR | 10-1050466 B | 7/2011 |

OTHER PUBLICATIONS

Korean Patent Abstracts Publication No. KR10-2004-0037889A dated May 8, 2004 for KR10-0579182, 1 page.

* cited by examiner

*Primary Examiner* — Thomas L Dickey
(74) *Attorney, Agent, or Firm* — Christie, Parker & Hale, LLP

(57) ABSTRACT

A thin film transistor includes a substrate, a gate electrode on the substrate, an active layer spaced from the gate electrode, a source electrode and a drain electrode spaced from the gate electrode and coupled to the active layer, a gate wiring at a same layer as the gate electrode and coupled to the gate electrode, and first conductive members electrically coupled to, and overlapping, the gate wiring.

21 Claims, 16 Drawing Sheets

THIN FILM TRANSISTOR AND ORGANIC LIGHT-EMITTING DISPLAY APPARATUS

CROSS-REFERENCE TO RELATED PATENT APPLICATION

This application claims priority to and the benefit of Korean Patent Application No. 10-2012-0104213, filed on Sep. 19, 2012, in the Korean Intellectual Property Office, the disclosure of which is incorporated herein in its entirety by reference.

BACKGROUND

1. Field

Embodiments of the present invention relate to a thin film transistor and an organic light-emitting display apparatus.

2. Description of the Related Art

Currently, conventional display apparatuses are being replaced by flat display apparatuses that are portable and thin. Among flat display apparatuses, organic light-emitting display apparatuses are self-emissive display apparatuses that are regarded as next-generation display apparatuses, due to having wide viewing angles, excellent contrast, and high response speeds.

An organic light-emitting display apparatus includes an intermediate layer, a first electrode, and a second electrode. The intermediate layer includes an organic emission layer and, if a suitable voltage is applied to the first electrode and the second electrode, the organic emission layer emits visible light. Also, the organic light-emitting display apparatus includes a plurality of thin film transistors each including various wirings. Further, organic light-emitting display apparatuses are being made bigger, and are being used to display high-resolution images.

However, characteristics of wirings of a thin film transistor included in organic light-emitting display apparatuses might not be easily improved and accordingly, image quality characteristics of the organic light-emitting display apparatuses might not be easily improved.

SUMMARY

Embodiments of the present invention provide a thin film transistor and an organic light-emitting display apparatus capable of improving its image quality characteristics.

According to an aspect of embodiments of the present invention, there is provided a thin film transistor including a substrate, a gate electrode on the substrate, an active layer spaced from the gate electrode, a source electrode and a drain electrode spaced from the gate electrode and coupled to the active layer, a gate wiring at a same layer as the gate electrode and coupled to the gate electrode, and first conductive members electrically coupled to, and overlapping, the gate wiring.

The gate wiring and the gate electrode may be integrally formed.

The first conductive members may be spaced apart from, and might not overlap, the gate electrode, the active layer, the source electrode, and the drain electrode.

A first insulating layer having first via holes may be between portions of the gate wiring and the first conductive members, and the gate wiring and the first conductive members may be coupled through the first via holes.

The active layer may be on the gate electrode, and the first conductive members may be formed at a same layer as the active layer.

The active layer may include an oxide semiconductor material.

The thin film transistor may further include a data wiring electrically coupled to the source electrode or to the drain electrode, and the data wiring may cross the gate wiring and may be spaced apart from the first conductive members.

The first conductive members might not overlap the data wiring.

The thin film transistor may further include second conductive members electrically coupled to, and overlapping, respective ones of the first conductive members.

The second conductive members may be spaced apart from, and might not overlap, the gate electrode, the active layer, the source electrode, and the drain electrode.

The thin film transistor may further include a second insulating layer that has second via holes and may be located between portions of the first conductive members and of the second conductive members, and respective ones of the first conductive members and the second conductive members may be coupled through the second via holes.

The second conductive members may overlap the gate wiring.

The gate electrode may be on the active layer, and the source electrode and the drain electrode may be on the gate electrode.

The thin film transistor may further include a first interlayer insulating layer and a second interlayer insulating layer stacked between the gate electrode and the source electrode, and between the gate electrode and the drain electrode.

The first interlayer insulating layer may have first via holes, and the first conductive members may be coupled to the gate wiring through the first via holes.

The second interlayer insulating layer may have second via holes, and the thin film transistor may further include second conductive members coupled to the first conductive members through the second via holes.

The source electrode may include a first source electrode and a second source electrode, the drain electrode may include a first drain electrode and a second drain electrode, the first interlayer insulating layer may have first contact holes, the second interlayer insulating layer may have second contact holes, the first source electrode and the first drain electrode may be electrically coupled to the active layer through the first contact holes, and the second source electrode and the second drain electrode may be respectively coupled to the first source electrode and the first drain electrode through the second contact holes.

According to another aspect of embodiments of the present invention, there is provided an organic light-emitting display apparatus including a substrate, a gate electrode on the substrate, an active layer spaced apart from the gate electrode, a source electrode and a drain electrode spaced apart from the gate electrode and coupled to the active layer, a gate wiring at a same layer as the gate electrode and coupled to the gate electrode, first conductive members electrically coupled to, and overlapping, the gate wiring, a first electrode electrically coupled to the source electrode or to the drain electrode, an intermediate layer on the first electrode and including an organic emission layer, and a second electrode on the intermediate layer.

One or more insulating layers may be between the source electrode and the first electrode, and between the drain electrode and the first electrode.

The first electrode may be formed at a same layer as the source electrode and the drain electrode.

The source electrode and the drain electrode may be formed after the first electrode is formed.

BRIEF DESCRIPTION OF THE DRAWINGS

The above and other aspects of embodiments of the present invention will become more apparent by describing in detail exemplary embodiments thereof with reference to the attached drawings in which.

DETAILED DESCRIPTION

Hereinafter, embodiments of the present invention will be described in detail by describing exemplary embodiments of the present invention with reference to the attached drawings.

Figure 1:
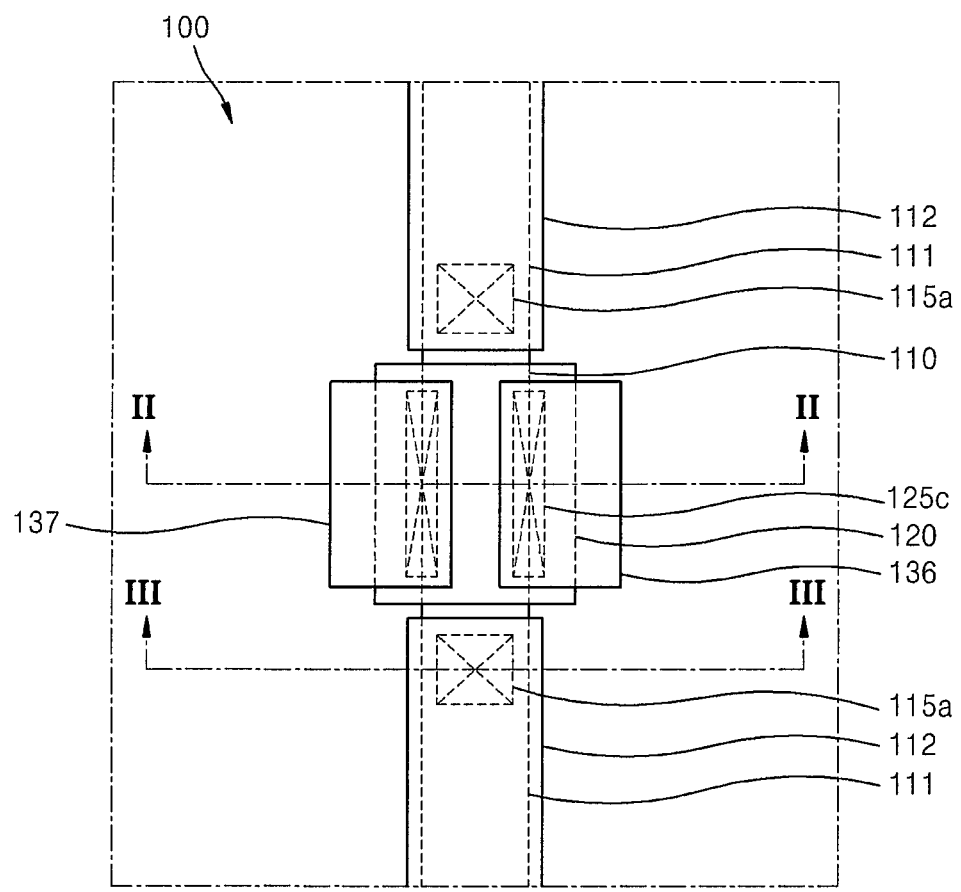
FIG. 1 is a plan view of a thin film transistor according to an embodiment of the present invention.
Figure 2:
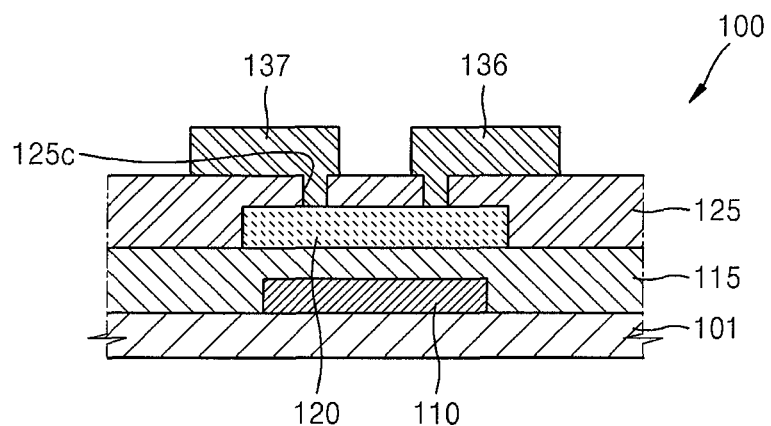
FIG. 2 is a cross-sectional view taken along the line II-II of FIG. 1.
Figure 3:
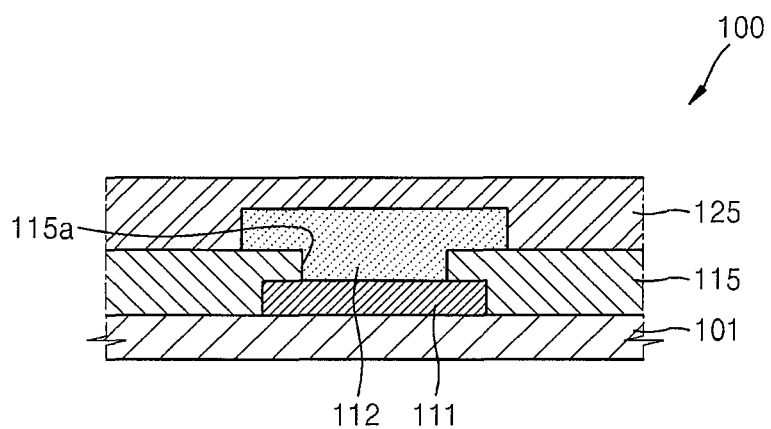
FIG. 3 is a cross-sectional view taken along the line III-III of FIG. 1.

FIG. 1 is a plan view of a thin film transistor 100 according to an embodiment of the present invention. FIG. 2 is a cross-sectional view taken along the line II-II of FIG. 1. FIG. 3 is a cross-sectional view taken along the line III-III of FIG. 1.

Referring to FIGS. 1 through 3, the thin film transistor 100 according to the current embodiment of the present invention includes a substrate 101, a gate electrode 110, an active layer 120, a source electrode 136, a drain electrode 137, a gate wiring 111, and first conductive members 112.

The substrate 101 may be formed of a transparent glass material including $SiO_2$ as a main component. However, the substrate 101 is not limited thereto, and may be formed of a transparent plastic material, which may include one or more of various suitable organic materials.

A buffer layer may be formed on the substrate 101. The buffer layer has functions of reducing or preventing penetration of undesired impure elements into the substrate 101, and of providing a flat surface on the substrate 101. The buffer layer may be formed of a suitable one of various materials having such functions.

The gate electrode 110 is formed on the substrate 101. The gate electrode 110 may contain, for example, gold (Au), silver (Ag), copper (Cu), nickel (Ni), platinum (Pt), palladium (Pd), aluminum (Al), or molybdenum (Mo), and may include an alloy such as, for example, an Al:Nd alloy or a Mo:W alloy. However, the gate electrode 110 is not limited thereto, and may be formed of various materials in consideration of adhesion to an adjacent layer, flatness, electric resistance, processability, etc.

The gate wiring 111 is electrically coupled to the gate electrode 110. For example, the gate electrode 110 and the gate wiring 111 may be integrally formed. An electrical signal may be applied to the gate electrode 110 via the gate wiring 111.

A first insulating layer 115 is formed on the gate electrode 110, and may also be formed on the gate wiring 111. The first insulating layer 115 has first via holes 115a that overlap regions of an upper surface of the gate wiring 111.

The active layer 120 is formed on the first insulating layer 115 to overlap the gate electrode 110. The active layer 120 includes various semiconductor materials, for example, a silicon-based inorganic semiconductor material, an organic semiconductor material, or an oxide semiconductor material. If the active layer 120 includes an oxide semiconductor material, the active layer 120 may include ZnO-based oxide, for example, a Ga—In—Zn—O-based material.

The first conductive members 112 are formed on the first insulating layer 115 so as to be spaced apart from the active layer 120 and to be electrically coupled to the gate wiring 111. In more detail, the first conductive members 112 are formed to overlap the first via holes 115a of the first insulating layer 115, and the first conductive members 112 and the gate wiring 111 are coupled through the first via holes 115a.

A second insulating layer 125 is formed on the active layer 120. The second insulating layer 125 is formed to protect the active layer 120, and more particularly, to protect a channel region of the active layer 120. Also, the second insulating layer 125 is formed to cover the first conductive members 112.

The source electrode 136 and the drain electrode 137 are formed to be coupled to the active layer 120. In more detail, the source electrode 136 and the drain electrode 137 are coupled to the active layer 120 through contact holes 125c of the second insulating layer 125.

The first conductive members 112 of the thin film transistor 100 according to the current embodiment of the present invention are coupled to the gate wiring 111. As such, resistance of the gate wiring 111 may be reduced. That is, because a voltage may be applied via the gate wiring 111 without increasing a width of the gate wiring 111, a display apparatus having a high resolution, a high aperture ratio, and a large size may be achieved by using the thin film transistor 100 according to the current embodiment of the present invention. The first conductive members 112 are formed to be spaced apart from, and to not overlap, the gate electrode 110. If the first conductive members 112 are formed on the gate electrode 110, insulation characteristics between the gate electrode 110 and the active layer 120 may deteriorate due to a combined thicknesses of the gate electrode 110 and the first conductive members 112, and a short circuit may occur between the gate electrode 110 and the source electrode 136 (or between the gate electrode 110 and the drain electrode 137). Also, to avoid this problem, a thickness of the first insulating layer 115 is increased. If the thickness of the first insulating layer 115 is increased, electrical characteristics of the thin film transistor 100 deteriorate, for example, a driving voltage of the thin film transistor 100 may be increased.

In the current embodiment of the present invention, because the first conductive members 112 do not overlap the gate electrode 110, and are coupled to only the gate wiring 111, a resistance of the gate wiring 111 may be reduced, and thus a resistance of the gate electrode 110 coupled to the gate wiring 111 may also be reduced, thereby improving electrical characteristics of the thin film transistor 100. Also, insulation characteristics between the gate electrode 110 and the active layer 120 may be maintained without increasing a thickness of the first insulating layer 115, and a short circuit defect between the gate electrode 110 and the source electrode 136 (or between the gate electrode 110 and the drain electrode 137) may be prevented or avoided.

Figure 4:
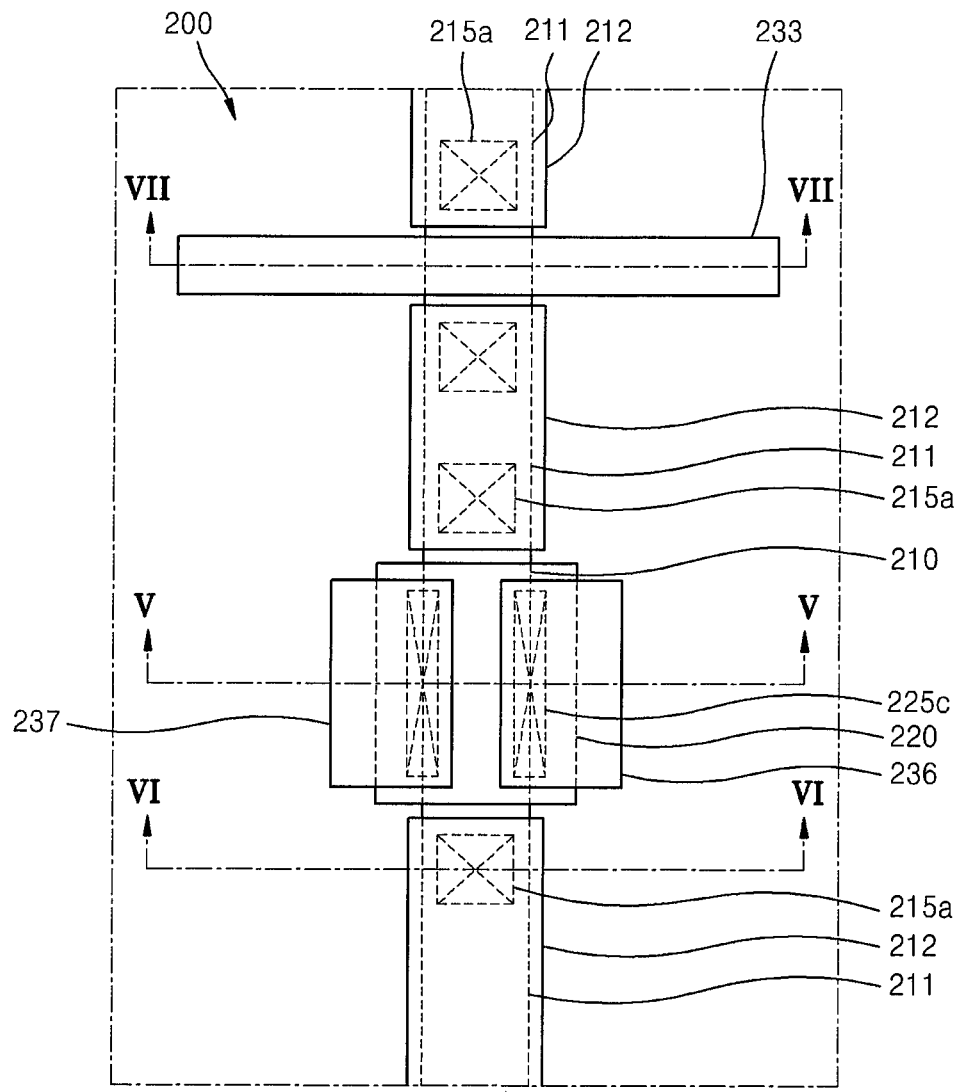
FIG. 4 is a plan view of a thin film transistor according to another embodiment of the present invention.
Figure 5:
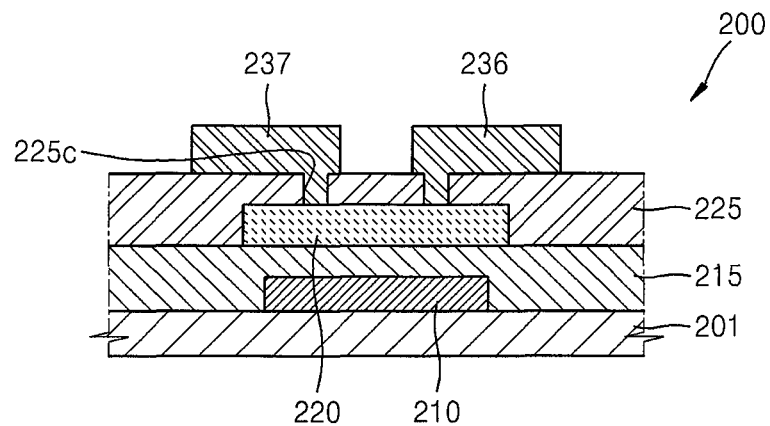
FIG. 5 is a cross-sectional view taken along the line V-V of FIG. 4.
Figure 6:
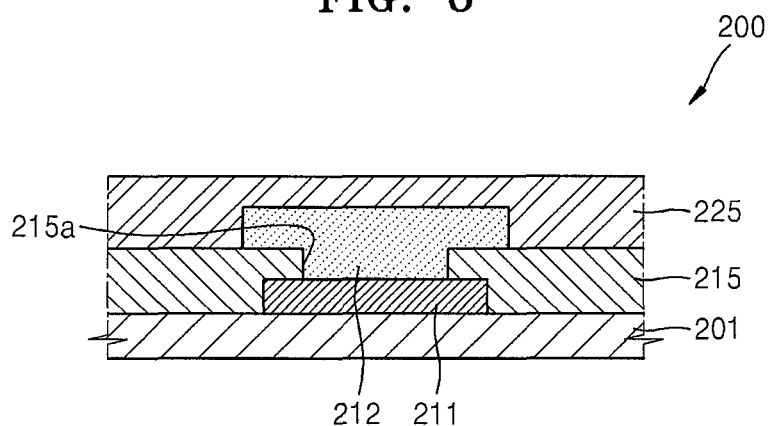
FIG. 6 is a cross-sectional view taken along the line VI-VI of FIG. 4.
Figure 7:
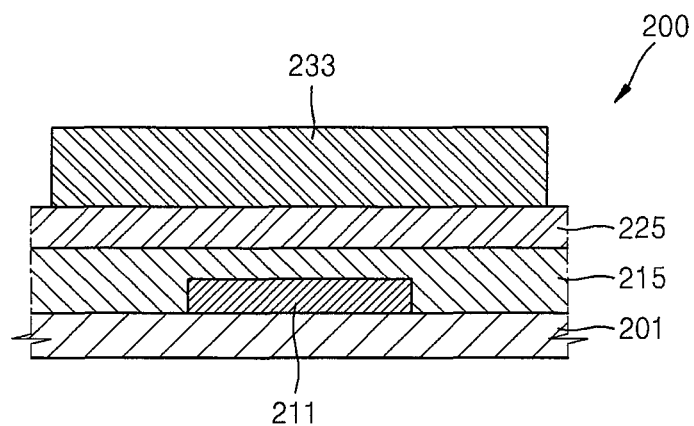
FIG. 7 is a cross-sectional view taken along the line VII-VII of FIG. 4.

FIG. 4 is a plan view of a thin film transistor 200 according to another embodiment of the present invention. FIG. 5 is a cross-sectional view taken along the line V-V of FIG. 4. FIG. 6 is a cross-sectional view taken along the line VI-VI of FIG. 4. FIG. 7 is a cross-sectional view taken along the line VII-VII of FIG. 4. For convenience of explanation, differences from the previous embodiment will be mainly described.

Referring to FIGS. 4 through 7, the thin film transistor 200 according to the current embodiment of the present invention includes a substrate 201, a gate electrode 210, an active layer 220, a source electrode 236, a drain electrode 237, a gate wiring 211, first conductive members 212, and a data wiring 233.

The gate electrode 210 is formed on the substrate 201. A buffer layer may be formed between the substrate 201 and the gate electrode 210.

The gate wiring 211 is electrically coupled to the gate electrode 210. For example, the gate electrode 210 and the gate wiring 211 may be integrally formed. An electrical signal may be applied to the gate electrode 210 via the gate wiring 211.

A first insulating layer 215 is formed on the gate electrode 210, and may also be formed on the gate wiring 211. The first insulating layer 215 has first via holes 215a, which are formed above an upper surface of the gate wiring 211.

The active layer 220 is formed on the first insulating layer 215, and overlaps the gate electrode 210. The active layer 220 includes various semiconductor materials, for example, a silicon-based inorganic semiconductor material, an organic semiconductor material, or an oxide semiconductor material. If the active layer 220 includes an oxide semiconductor material, the active layer 220 may include ZnO-based oxide, for example, a Ga—In—Zn—O-based material.

The first conductive members 212 are formed on the first insulating layer 215 apart from the active layer 220 and electrically coupled to the gate wiring 211. In more detail, the first conductive members 212 overlap the first via holes 215a of the first insulating layer 215, and the first conductive members 212 and the gate wiring 211 are coupled through the first via holes 215a.

A second insulating layer 225 is formed on the active layer 220 to protect the active layer 220, and more particularly, to protect a channel region of the active layer 220. Also, the second insulating layer 225 is formed to cover the first conductive members 212.

The source electrode 236 and the drain electrode 237 are formed to be coupled to the active layer 220 through contact holes 225c of the second insulating layer 225.

The data wiring 233 is formed on the second insulating layer 225, and may be electrically coupled to, and may apply an electrical signal to, the source electrode 236 or the drain electrode 237. The data wiring 233 is formed to cross the gate wiring 211.

Also, the data wiring 233 is spaced apart from the first conductive members 212. In more detail, as illustrated in FIG. 4, the data wiring 233 is formed to correspond to (e.g., formed above) a space between the first conductive members 212. That is, the first conductive members 212 do not overlap the data wiring 233.

The first conductive members 212 of the thin film transistor 200 according to the current embodiment of the present invention are coupled to the gate wiring 211. As such, a resistance of the gate wiring 211 may be reduced. That is, because a voltage may be applied via the gate wiring 211 without increasing a width of the gate wiring 211, a display apparatus having a high resolution, a high aperture ratio, and a large size may be achieved using the thin film transistor 200 according to the current embodiment of the present invention.

The first conductive members 212 are spaced apart from, and do not overlap the gate electrode 210. If the first conductive members 212 are also formed on the gate electrode 210, insulation characteristics between the gate electrode 210 and the active layer 220 may deteriorate due to thicknesses of the gate electrode 210 and the first conductive members 212, and a short circuit defect may occur between the gate electrode 210 and the source electrode 236 (or between the gate electrode 210 and the drain electrode 237). Also, to avoid this problem, a thickness of the first insulating layer 215 may be increased. If the thickness of the first insulating layer 215 is increased, electrical characteristics of the thin film transistor 200 deteriorate, for example, a driving voltage of the thin film transistor 200 is increased.

In the current embodiment of the present invention, because the first conductive members 212 do not overlap the gate electrode 210, and are coupled to only the gate wiring 211, a resistance of the gate wiring 211 may be reduced, and thus a resistance of the gate electrode 210 coupled to the gate wiring 211 may also be reduced, thereby improving electrical characteristics of the thin film transistor 200. Also, insulation characteristics between the gate electrode 210 and the active layer 220 may be maintained without increasing a thickness of the first insulating layer 215, and a short circuit defect between the gate electrode 210 and the source electrode 236 (or between the gate electrode 210 and the drain electrode 237) may be prevented or avoided.

Furthermore, in the current embodiment of the present invention, the data wiring 233 crossing the gate wiring 211 is spaced apart from the first conductive members 212, and does not overlap the first conductive members 212. As such, electrical characteristics of the thin film transistor 200 may be improved while reducing or minimizing an undesired electric capacity (e.g., capacitance) generated between the gate wiring 211 and the data wiring 233.

Figure 8:
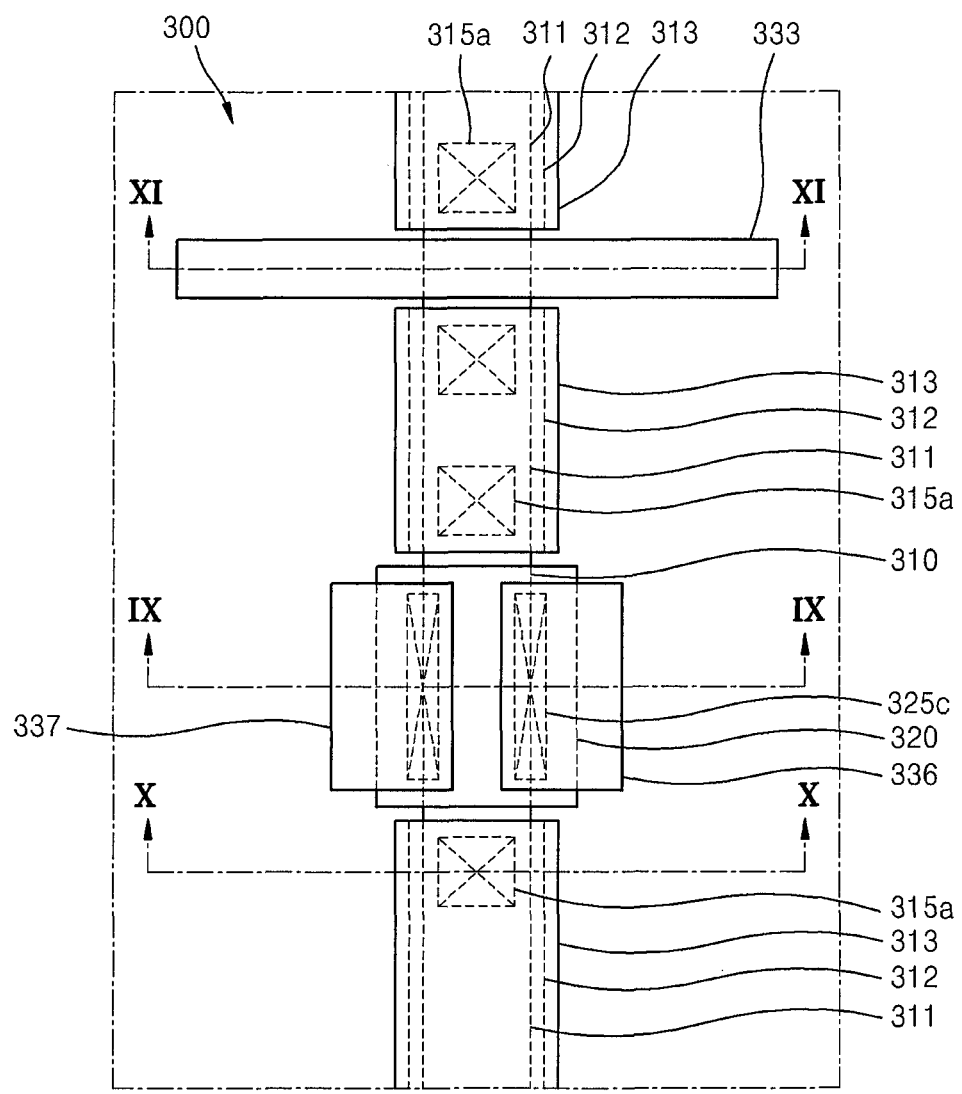
FIG. 8 is a plan view of a thin film transistor according to another embodiment of the present invention.
Figure 9:
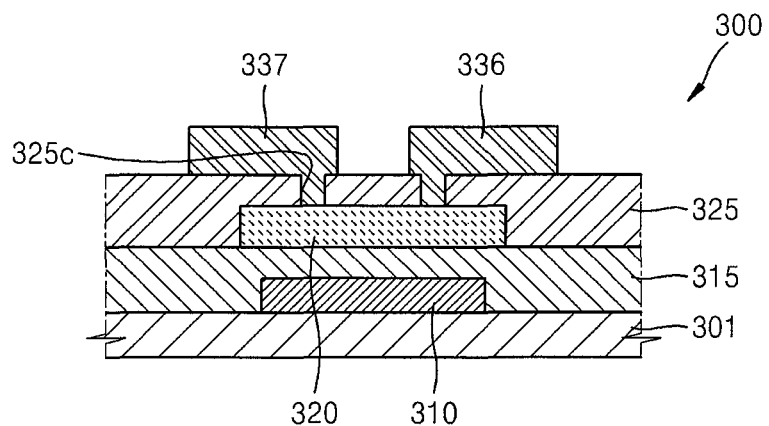
FIG. 9 is a cross-sectional view taken along the line IX-IX of FIG. 8.
Figure 10:
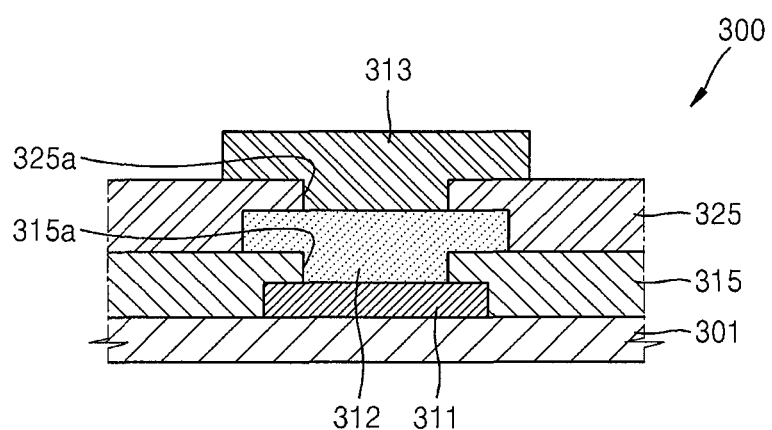
FIG. 10 is a cross-sectional view taken along the line X-X of FIG. 8.
Figure 11:
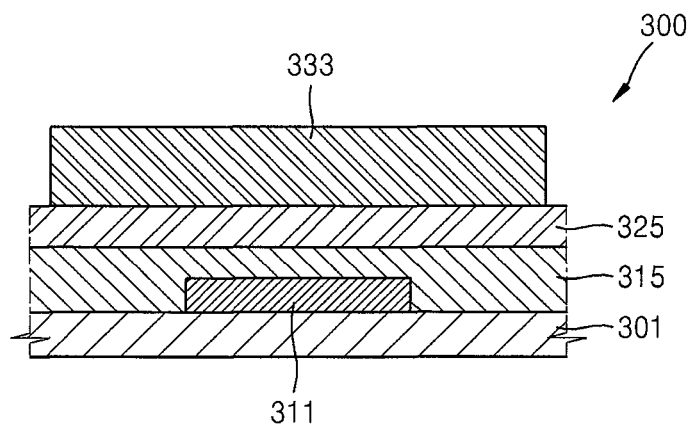
FIG. 11 is a cross-sectional view taken along the line XI-XI of FIG. 8.

FIG. 8 is a plan view of a thin film transistor 300 according to another embodiment of the present invention. FIG. 9 is a cross-sectional view taken along the line E-E of FIG. 8. FIG. 10 is a cross-sectional view taken along the line X-X of FIG. 8. FIG. 11 is a cross-sectional view taken along the line XI-XI of FIG. 8. For convenience of explanation, differences from the previous embodiments will be mainly described.

Referring to FIGS. 8 through 11, the thin film transistor 300 according to the current embodiment of the present invention includes a substrate 301, a gate electrode 310, an active layer 320, a source electrode 336, a drain electrode 337, a gate wiring 311, first conductive members 312, a data wiring 333, and second conductive members 313.

The gate electrode 310 is formed on the substrate 301. A buffer layer may be formed between the substrate 301 and the gate electrode 310.

The gate wiring 311 is electrically coupled to the gate electrode 310. For example, the gate electrode 310 and the gate wiring 311 may be integrally formed. An electrical signal may be applied to the gate electrode 310 via the gate wiring 311.

A first insulating layer 315 is formed on the gate electrode 310, and may also be formed on the gate wiring 311. The first insulating layer 315 has first via holes 315a that overlap regions of an upper surface of the gate wiring 311.

The active layer 320 is formed on the first insulating layer 315, and overlaps the gate electrode 310. The active layer 320 includes various semiconductor materials, for example, a silicon-based inorganic semiconductor material, an organic semiconductor material, or an oxide semiconductor material. If the active layer 320 includes an oxide semiconductor material, the active layer 320 may include ZnO-based oxide, for example, a Ga—In—Zn—O-based material.

The first conductive members 312 are formed on the first insulating layer 315, are spaced apart from the active layer 320, and are electrically coupled to the gate wiring 311, and may be formed to overlap the first via holes 315a of the first insulating layer 315, and the first conductive members 312 and the gate wiring 311 are coupled through the first via holes 315a.

A second insulating layer 325 is formed on the active layer 320, and is formed to protect the active layer 320, and more particularly, to protect a channel region of the active layer 320. Also, the second insulating layer 325 is formed on the first conductive members 312 and has second via holes 325a corresponding to upper surfaces of the first conductive members 312.

The source electrode 336 and the drain electrode 337 are formed to be coupled to the active layer 320 through contact holes 325c of the second insulating layer 325.

The second conductive members 313 are formed on the second insulating layer 325 spaced apart from the active layer 320 and the gate electrode 310, and are electrically coupled to the first conductive members 312. In more detail, the second conductive members 313 overlap the second via holes 325a of the second insulating layer 325, and the first conductive members 312 and the second conductive members 313 are coupled to each other through the second via holes 325a. Also, the second conductive members 313 may be formed of the same material as the source electrode 336 or the drain electrode 337.

The data wiring 333 is formed on the second insulating layer 325, and may be electrically coupled to, and may apply an electrical signal to, the source electrode 336 or the drain electrode 337. The data wiring 333 is formed to cross the gate wiring 311.

Also, the data wiring 333 is formed to be spaced apart from the first conductive members 312 and the second conductive members 313. In more detail, as illustrated in FIG. 8, the data wiring 333 is formed to correspond to (e.g., formed above) a space between the first conductive members 312 and a space between the second conductive members 313.

The first conductive members 312 of the thin film transistor 300 according to the current embodiment of the present invention are coupled to the gate wiring 311. As such, a resistance of the gate wiring 311 may be reduced. That is, because a voltage may be applied via the gate wiring 311 without increasing a width of the gate wiring 311, a display apparatus having a high resolution, a high aperture ratio, and a large size may be achieved using the thin film transistor 300 according to the current embodiment of the present invention. Also, because the second conductive members 313 are formed to be coupled to the first conductive members 312, the resistance of the gate wiring 311 may be further reduced.

The first conductive members 312 and the second conductive members 313 are spaced apart from, and do not overlap, the gate electrode 310. Because the first conductive members 312 and the second conductive members 313 do not overlap the gate electrode 310, and are coupled to only the gate wiring 311, a resistance of the gate wiring 311 may be reduced, and thus a resistance of the gate electrode 310 coupled to the gate wiring 311 may also be reduced, thereby improving electrical characteristics of the thin film transistor 300. Also, insulation characteristics between the gate electrode 310 and the active layer 320 may be maintained without increasing a thickness of the first insulating layer 315, and a short circuit between the gate electrode 310 and the source electrode 336 (or between the gate electrode 310 and the drain electrode 337) may be prevented or avoided.

Furthermore, in the current embodiment of the present invention, the data wiring 333 crossing the gate wiring 311 is spaced apart from the first conductive members 312, and more particularly, does not overlap the first conductive members 312 and the second conductive members 313. As such, electrical characteristics of the thin film transistor 300 may be improved while reducing or minimizing an undesired electric capacity (e.g., capacitance) generated between the gate wiring 311 and the data wiring 333. In the thin film transistor 300 according to the current embodiment of the present invention, the data wiring 333 need not be formed.

Figure 12:
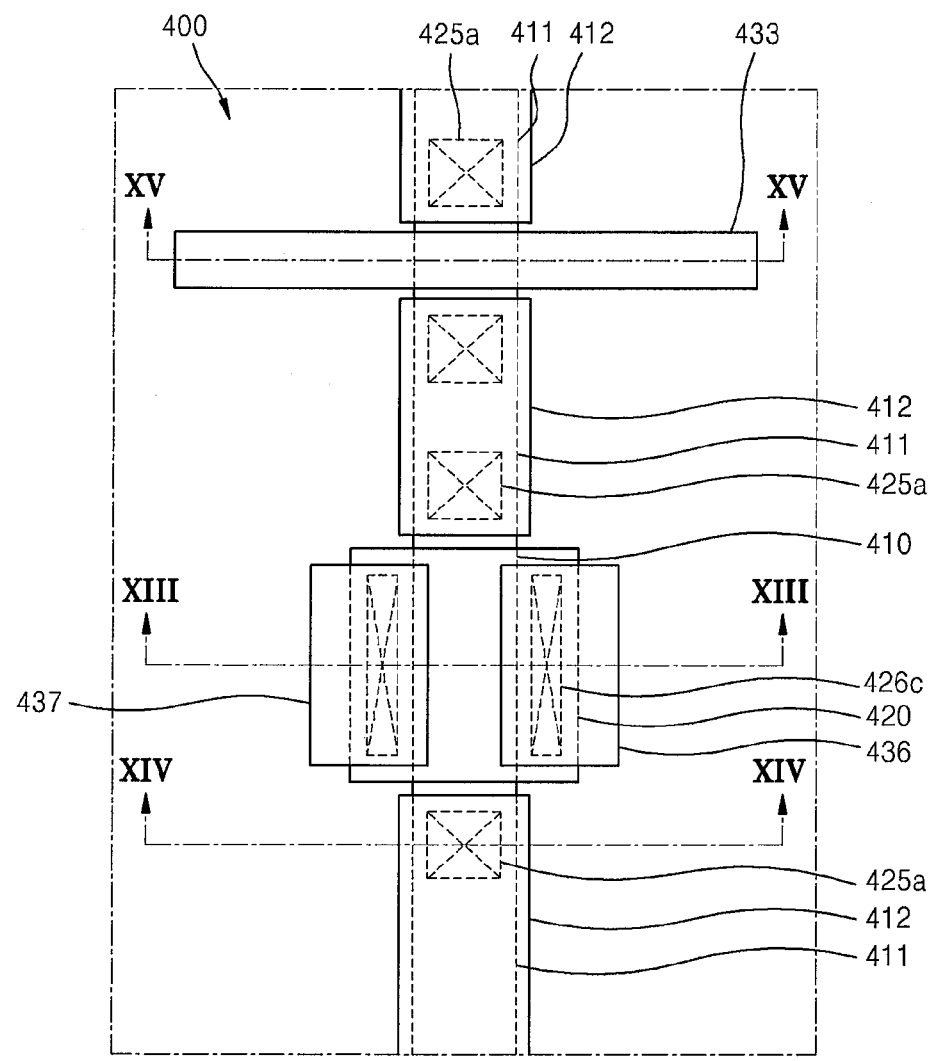
FIG. 12 is a plan view of a thin film transistor according to another embodiment of the present invention.
Figure 13:
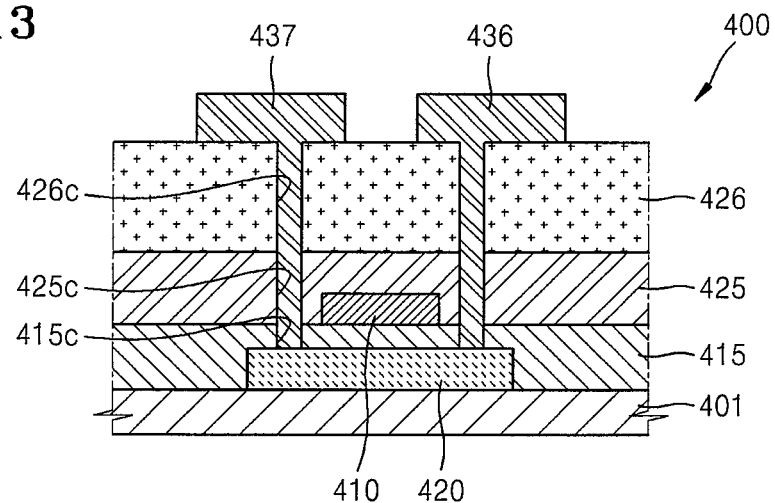
FIG. 13 is a cross-sectional view taken along the line XIII-XIII of FIG. 12.
Figure 14:
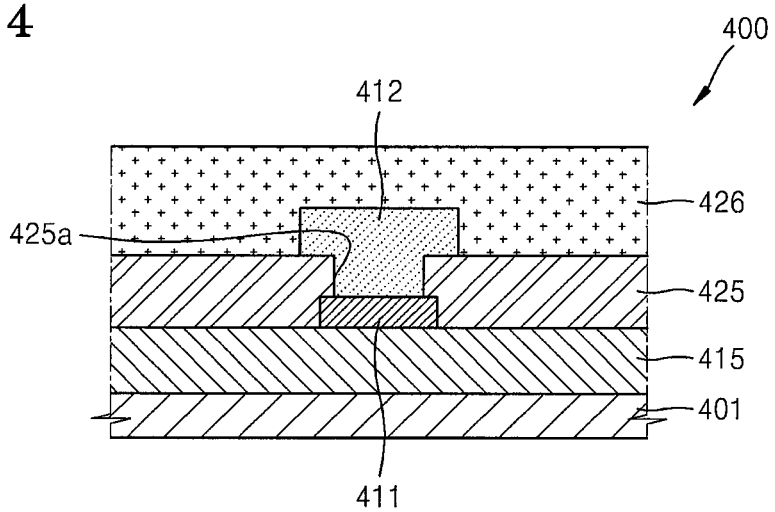
FIG. 14 is a cross-sectional view taken along the line XIV-XIV of FIG. 12.
Figure 15:
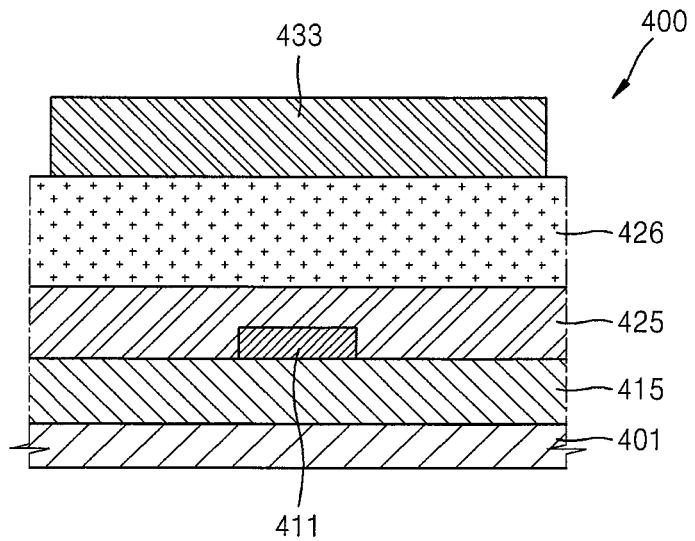
FIG. 15 is a cross-sectional view taken along the line XV-XV of FIG. 12.

FIG. 12 is a plan view of a thin film transistor 400 according to another embodiment of the present invention. FIG. 13 is a cross-sectional view taken along the line XIII-XIII of FIG. 12. FIG. 14 is a cross-sectional view taken along the line XIV-XIV of FIG. 12. FIG. 15 is a cross-sectional view taken along the line XV-XV of FIG. 12. For convenience of explanation, differences from the previous embodiments will be mainly described.

Referring to FIGS. 12 through 15, the thin film transistor 400 according to the current embodiment of the present invention includes a substrate 401, a gate electrode 410, an active layer 420, a source electrode 436, a drain electrode 437, a gate wiring 411, first conductive members 412, and a data wiring 433.

The active layer 420 is formed on the substrate 401. A buffer layer may be formed between the substrate 401 and the active layer 420. The active layer 420 includes various semiconductor materials, for example, a silicon-based inorganic semiconductor material, an organic semiconductor material, or an oxide semiconductor material.

The gate electrode 410 is formed on the active layer 420, and the gate electrode 410 and the active layer 420 are insulated from each other by a gate insulating layer 415.

The gate wiring 411 is electrically coupled to the gate electrode 410. For example, the gate electrode 410 and the gate wiring 411 may be integrally formed. An electrical signal may be applied to the gate electrode 410 via the gate wiring 411.

A first interlayer insulating layer 425 is formed on the gate electrode 410, and may be formed on the gate wiring 411. The first interlayer insulating layer 425 has first via holes 425a, which overlap regions of an upper surface of the gate wiring 411.

The first conductive members 412 are formed on the first interlayer insulating layer 425, may be spaced apart from the active layer 420, and may be coupled to the gate wiring 411. In more detail, the first conductive members 412 overlap the first via holes 425a of the first interlayer insulating layer 425, and the first conductive members 412 and the gate wiring 411 are coupled through the first via holes 425a.

A second interlayer insulating layer 426 is formed on the first interlayer insulating layer 425 to cover the first conductive members 412.

The source electrode 436 and the drain electrode 437 are coupled to the active layer 420 through contact holes 415c of the gate insulating layer 415, first contact holes 425c of the first interlayer insulating layer 425, and second contact holes 426c of the second interlayer insulating layer 426.

The data wiring 433 is formed on the second interlayer insulating layer 426, and may be electrically coupled to, and may apply an electrical signal to, the source electrode 436 or the drain electrode 437. The data wiring 433 is formed to cross the gate wiring 411.

Also, the data wiring 433 is spaced apart from the first conductive members 412. In more detail, as illustrated in FIG. 12, the data wiring 433 is formed to correspond to (e.g., formed above) a space between the first conductive members 412. That is, the first conductive members 412 do not overlap the data wiring 433.

The first conductive members 412 of the thin film transistor 400 according to the current embodiment of the present invention are coupled to the gate wiring 411. As such, a resistance of the gate wiring 411 may be reduced. That is, because a voltage may be applied via the gate wiring 411 without increasing a width of the gate wiring 411, a display apparatus having a high resolution, a high aperture ratio, and a large size may be achieved using the thin film transistor 400 according to the current embodiment of the present invention.

The first conductive members 412 are spaced apart from, and do not overlap, the gate electrode 410. If the first conductive members 412 are also formed on the gate electrode 410, insulation characteristics between the gate electrode 410 and the active layer 420 may deteriorate due to thicknesses of the gate electrode 410 and the first conductive members 412, and a short circuit defect may occur between the gate electrode 410 and the source electrode 436 (or between the gate electrode 410 and the drain electrode 437).

In the current embodiment of the present invention, because the first conductive members 412 do not overlap the gate electrode 410, and are coupled to only the gate wiring 411, a resistance of the gate wiring 411 may be reduced, and thus a resistance of the gate electrode 410 coupled to the gate wiring 411 may also be reduced, thereby improving electrical characteristics of the thin film transistor 400. Also, insulation characteristics between the gate electrode 410 and the active layer 420 may be maintained without increasing a thickness of the gate insulating layer 415, and a short circuit between the gate electrode 410 and the first conductive members 412 and the source electrode 436/the drain electrode 437 may be prevented or avoided.

Furthermore, in the current embodiment of the present invention, the data wiring 433 crossing the gate wiring 411 is spaced apart from the first conductive members 412, and more particularly, does not overlap the first conductive members 412. As such, electrical characteristics of the thin film transistor 400 may be improved while reducing or minimizing an undesired electric capacity (e.g., capacitance) generated between the gate wiring 411 and the data wiring 433.

Figure 16:
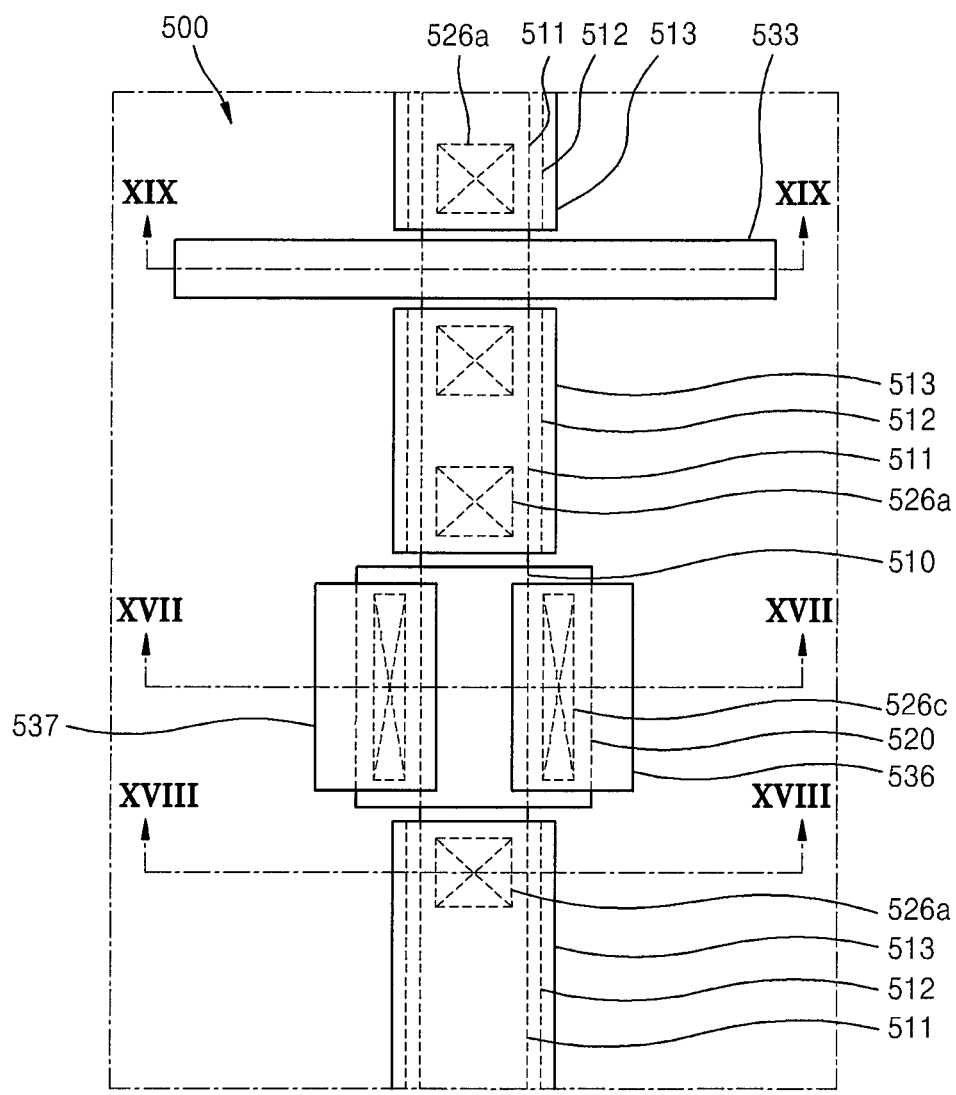
FIG. 16 is a plan view of a thin film transistor according to another embodiment of the present invention.
Figure 17:
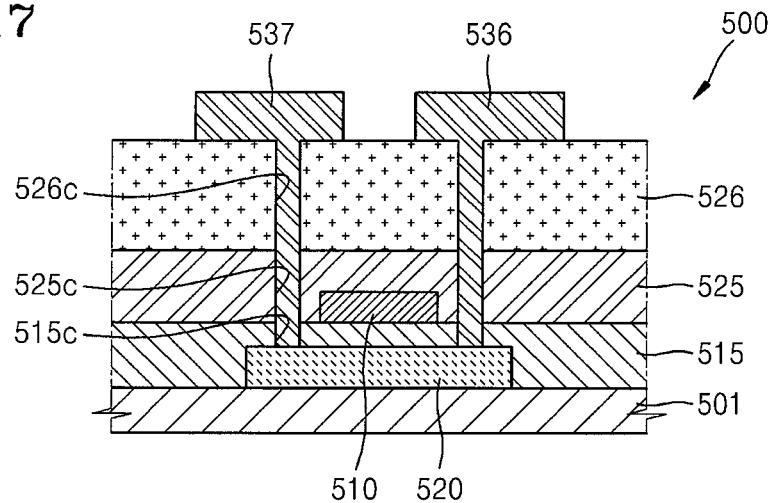
FIG. 17 is a cross-sectional view taken along the line XVII-XVII of FIG. 16.
Figure 18:
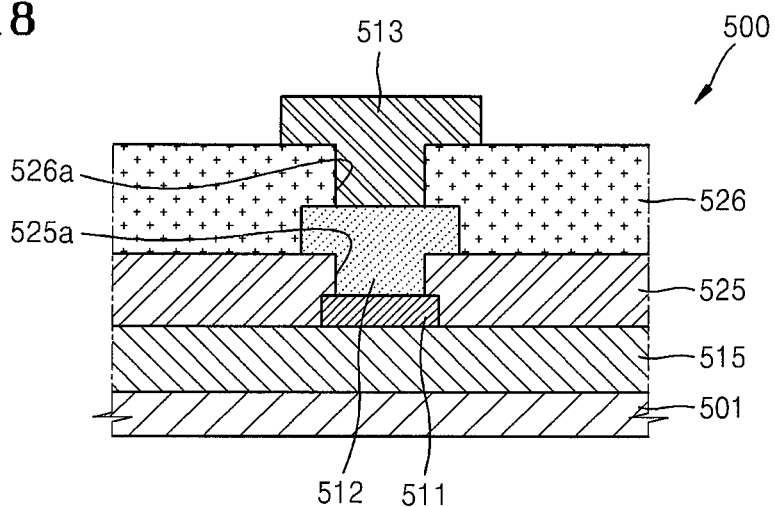
FIG. 18 is a cross-sectional view taken along the line XVII-XVII of FIG. 16.
Figure 19:
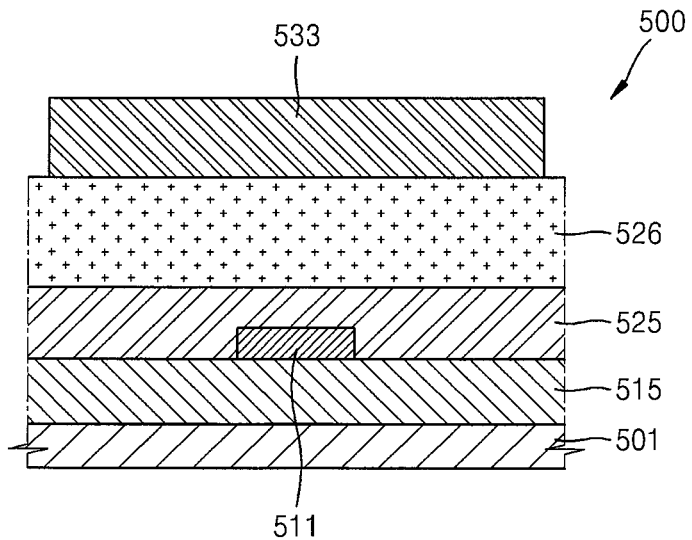
FIG. 19 is a cross-sectional view taken along the line XIX-XIX of FIG. 16.

FIG. 16 is a plan view of a thin film transistor 500 according to another embodiment of the present invention. FIG. 17 is a cross-sectional view taken along the line XVII-XVII of FIG. 16. FIG. 18 is a cross-sectional view taken along the line XVIII-XVIII of FIG. 16. FIG. 19 is a cross-sectional view taken along the line XIX-XIX of FIG. 16. For convenience of explanation, differences from the previous embodiments will be mainly described.

Referring to FIGS. 16 through 19, the thin film transistor 500 according to the current embodiment of the present invention includes a substrate 501, a gate electrode 510, an active layer 520, a source electrode 536, a drain electrode 537, a gate wiring 511, first conductive members 512, second conductive members 513, and a data wiring 533.

The active layer 520 is formed on the substrate 501. A buffer layer may be formed between the substrate 501 and the active layer 520. The active layer 520 includes various semiconductor materials, for example, a silicon-based inorganic semiconductor material, an organic semiconductor material, or an oxide semiconductor material.

The gate electrode 510 is formed on the active layer 520, and the gate electrode 510 and the active layer 520 are insulated from each other by a gate insulating layer 515.

The gate wiring 511 is electrically coupled to the gate electrode 510. For example, the gate electrode 510 and the gate wiring 511 may be integrally formed. An electrical signal may be applied to the gate electrode 510 via the gate wiring 511.

A first interlayer insulating layer 525 is formed on the gate electrode 510, and may also be formed on the gate wiring 511. The first interlayer insulating layer 525 has first via holes 525a that overlap regions of an upper surface of the gate wiring 511.

The first conductive members 512 are formed on the first interlayer insulating layer 525, and are spaced apart from the active layer 520, and coupled to the gate wiring 511. In more detail, the first conductive members 512 overlap the first via holes 525a of the first interlayer insulating layer 525, and the first conductive members 512 and the gate wiring 511 are coupled through the first via holes 525a.

A second interlayer insulating layer 526 is formed on the first interlayer insulating layer 525 to cover the first conductive members 512.

The source electrode 536 and the drain electrode 537 are formed to be coupled to the active layer 520 through contact holes 515c of the gate insulating layer 515, first contact holes 525c of the first interlayer insulating layer 525, and second contact holes 526c of the second interlayer insulating layer 526.

The second conductive members 513 are formed on the second insulating layer 526, are spaced apart from the active layer 520 and the gate electrode 510, and are electrically coupled to the first conductive members 512. In more detail, the second conductive members 513 are formed to overlap second via holes 526a of the second insulating layer 526, and the first conductive members 512 and the second conductive members 513 are coupled to each other through the second via holes 526a. Also, the second conductive members 513 may be formed of the same material as the source electrode 536 or the drain electrode 537.

The data wiring 533 is formed on the second interlayer insulating layer 526. The data wiring 533 may be electrically coupled to, and may apply an electrical signal to, the source electrode 536 or the drain electrode 537. The data wiring 533 is formed to cross the gate wiring 511. Also, the data wiring 533 is formed to be spaced apart from the first conductive members 512 and the second conductive members 513. In more detail, as illustrated in FIG. 16, the data wiring 533 is formed to correspond to (e.g., formed above) a space between the first conductive members 512 and a space between the second conductive members 513. That is, the first conductive members 512 and the second conductive members 513 do not overlap the data wiring 533.

The first conductive members 512 of the thin film transistor 500 according to the current embodiment of the present invention are coupled to the gate wiring 511. As such, a resistance of the gate wiring 511 may be reduced. That is, because a voltage may be applied via the gate wiring 511 without increasing a width of the gate wiring 511, a display apparatus having a high resolution, a high aperture ratio, and a large size may be achieved by using the thin film transistor 500 according to the current embodiment of the present invention. Also, because the second conductive members 513 are formed to be coupled to the first conductive members 512, the resistance of the gate wiring 511 may be further reduced.

Further, the first conductive members 512 and the second conductive members 513 are spaced apart from, and do not overlap, the gate electrode 510. Because the first conductive members 512 and the second conductive members 513 do not overlap the gate electrode 510, and are coupled to only the gate wiring 511, a resistance of the gate wiring 511 may be reduced, and thus a resistance of the gate electrode 510 coupled to the gate wiring 511 may also be reduced, thereby improving electrical characteristics of the thin film transistor 500. Also, insulation characteristics between the gate electrode 510 and the active layer 520 may be maintained without increasing a thickness of the first insulating layer 515, and a short circuit defect between the gate electrode 510 and the source electrode 536 (or the drain electrode 537) may be avoided or prevented without increasing thicknesses of the first interlayer insulating layer 525 and the second interlayer insulating layer 526.

Furthermore, in the current embodiment of the present invention, the data wiring 533 crossing the gate wiring 511 is spaced apart from the first conductive members 512 and the second conductive members 513, and does not overlap the first conductive members 512 and the second conductive members 513. As such, electrical characteristics of the thin film transistor 500 may be improved while reducing or minimizing an undesired electric capacity (e.g., capacitance) generated between the gate wiring 511 and the data wiring 533.

In the thin film transistor 500 according to the current embodiment of the present invention, the data wiring 533 need not be formed.

Figure 20:
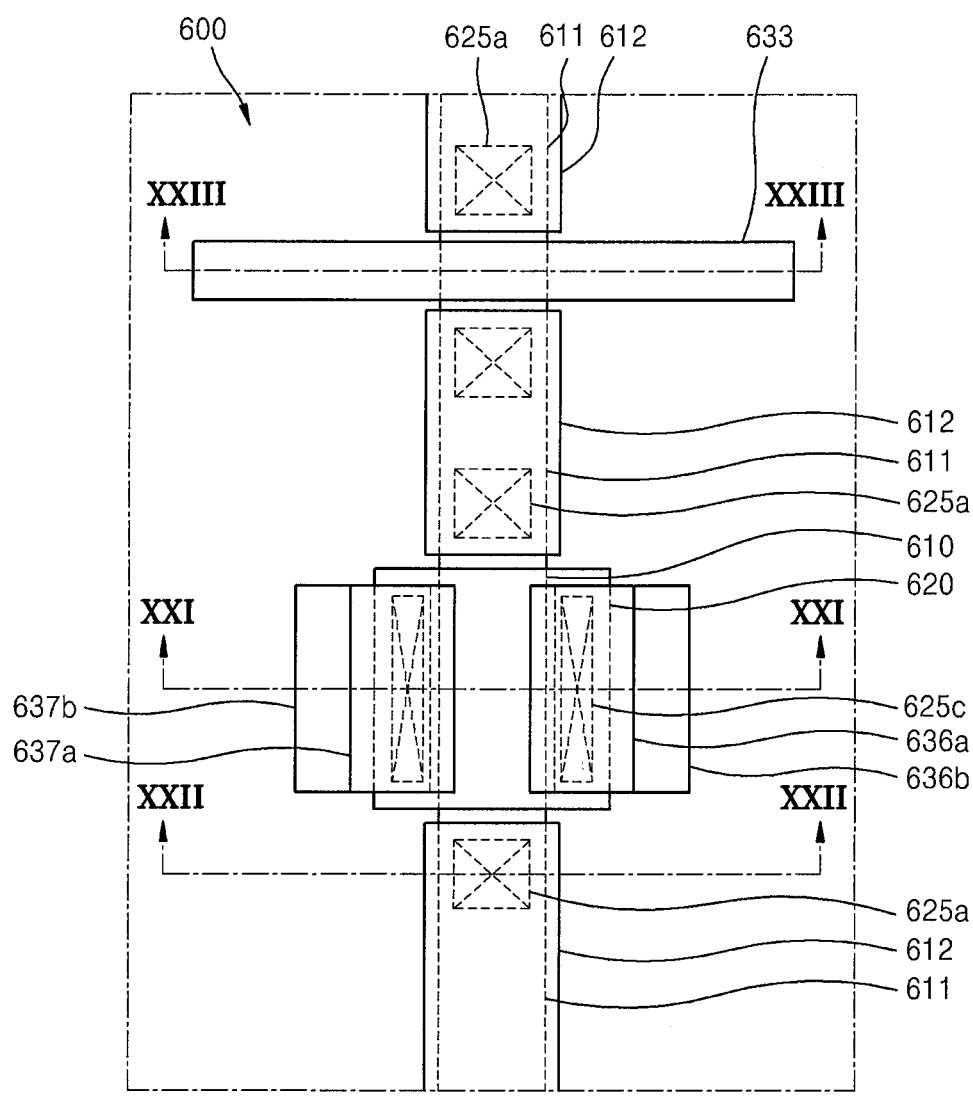
FIG. 20 is a plan view of a thin film transistor according to another embodiment of the present invention.
Figure 21:
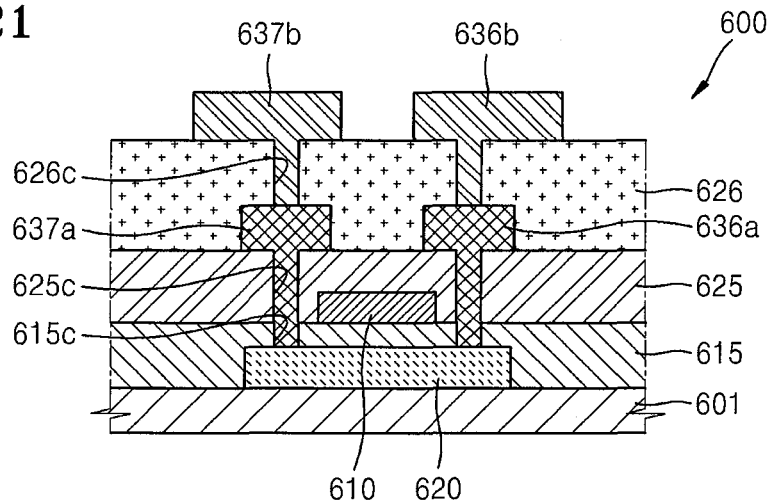
FIG. 21 is a cross-sectional view taken along the line XXI-XXI of FIG. 20.
Figure 22:
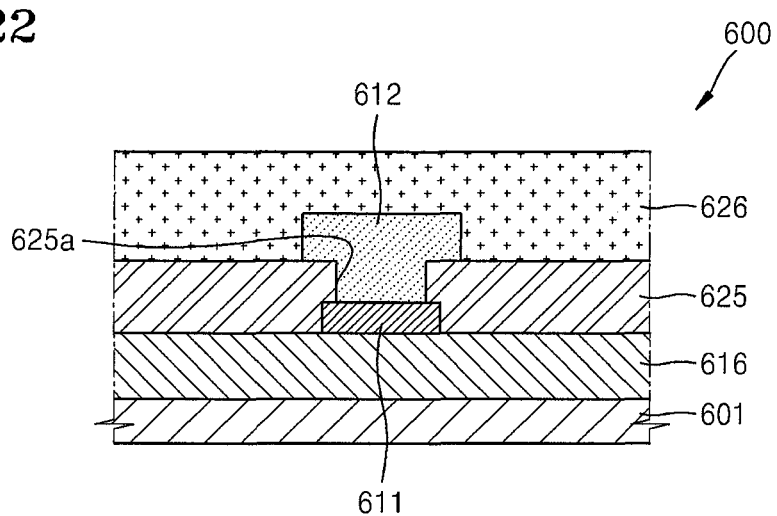
FIG. 22 is a cross-sectional view taken along the line XXII-XXII of FIG. 20.
Figure 23:
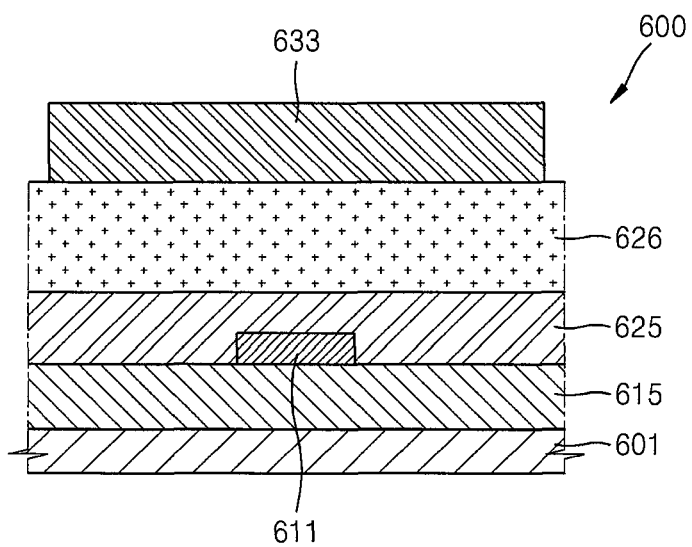
FIG. 23 is a cross-sectional view taken along the line XXIII-XXIII of FIG. 20.

FIG. 20 is a plan view of a thin film transistor 600 according to another embodiment of the present invention. FIG. 21 is a cross-sectional view taken along the line XXI-XXI of FIG. 20. FIG. 22 is a cross-sectional view taken along the line XXII-XXII of FIG. 20. FIG. 23 is a cross-sectional view taken along the line XXIII-XXIII of FIG. 20. For convenience of explanation, differences from the previous embodiments will be mainly described.

Referring to FIGS. 20 through 23, the thin film transistor 600 according to the current embodiment of the present invention includes a substrate 601, a gate electrode 610, an active layer 620, first and second source electrodes 636a and 636b, first and second drain electrodes 637a and 637b, a gate wiring 611, first conductive members 612, and a data wiring 633.

The active layer 620 is formed on the substrate 601. A buffer layer may be formed between the substrate 601 and the active layer 620. The active layer 620 includes various semiconductor materials, for example, a silicon-based inorganic semiconductor material, an organic semiconductor material, or an oxide semiconductor material.

The gate electrode 610 is formed on the active layer 620, and the gate electrode 610 and the active layer 620 are insulated from each other by a gate insulating layer 615.

The gate wiring 611 is electrically coupled to the gate electrode 610. For example, the gate electrode 610 and the gate wiring 611 may be integrally formed. An electrical signal may be applied to the gate electrode 610 via the gate wiring 611.

A first interlayer insulating layer 625 is formed on the gate electrode 610. In the present embodiment of the present invention, the first interlayer insulating layer 625 is also formed on the gate wiring 611. The first interlayer insulating layer 625 has first via holes 625a that are formed to overlap regions of an upper surface of the gate wiring 611.

The first conductive members 612 are formed on the first interlayer insulating layer 625 spaced apart from the active layer 620 and coupled to the gate wiring 611. In more detail, the first conductive members 612 are formed to overlap the first via holes 625a of the first interlayer insulating layer 625, and the first conductive members 612 and the gate wiring 611 are coupled through the first via holes 625a.

The first source electrode 636a and the first drain electrode 637a are formed on the first interlayer insulating layer 625. The first source electrode 636a and the first drain electrode 637a are electrically coupled to the active layer 620 through first contact holes 625c of the first interlayer insulating layer 625 and contact holes 615c of the gate insulating layer 615.

A second interlayer insulating layer 626 is formed on the first interlayer insulating layer 625 to cover the first conductive members 612. Also, the second interlayer insulating layer 626 is formed on the first source electrode 636a and the first drain electrode 637a.

The second source electrode 636b and the second drain electrode 637b are formed to be respectively coupled to the first source electrode 636a and the first drain electrode 637a through second contact holes 626c of the second interlayer insulating layer 626.

The data wiring 633 is formed on the second interlayer insulating layer 626. The data wiring 633 may be electrically coupled to, and may apply an electrical signal to, the first and second source electrodes 636a and 636b or the first and second drain electrodes 637a and 637b. The data wiring 633 is formed to cross the gate wiring 611.

Also, the data wiring 633 is formed to be spaced apart from the first conductive members 612. In more detail, as illustrated in FIG. 20, the data wiring 633 is formed to correspond to (e.g., formed above) a space between the first conductive members 612. That is, the first conductive members 612 do not overlap the data wiring 633.

The first conductive members 612 of the thin film transistor 600 according to the current embodiment of the present invention are coupled to the gate wiring 611. As such, a resistance of the gate wiring 611 may be reduced. That is, because a voltage may be applied via the gate wiring 611 without increasing a width of the gate wiring 611, a display apparatus having a high resolution, a high aperture ratio, and a large size may be achieved by using the thin film transistor 600 according to the current embodiment of the present invention.

Further, the first conductive members 612 are formed to be spaced apart from, and to not overlap, the gate electrode 610. If the first conductive members 612 are also formed on the gate electrode 610, insulation characteristics between the gate electrode 610 and the active layer 620 may deteriorate due to thicknesses of the gate electrode 610 and the first conductive members 612, and a short circuit defect may occur between the gate electrode 610 and the first and/or second source electrodes 636a and 636b (or between the gate electrode 610 and the first and/or second drain electrodes 637a and 637b).

In the current embodiment of the present invention, because the first conductive members 612 do not overlap the gate electrode 610, and are coupled to only the gate wiring 611, a resistance of the gate wiring 611 may be reduced, and thus a resistance of the gate electrode 610 coupled to the gate wiring 611 may also be reduced, thereby improving electrical characteristics of the thin film transistor 600.

Also, in the current embodiment of the present invention, because the second source electrode 636b is coupled to the first source electrode 636a, and because the second drain electrode 637b is coupled to the first drain electrode 637a, a resistance of the first and second source electrodes 636a and 636b and the first and second drain electrodes 637a and 637b may be reduced without increasing an overall width of the first and second source electrodes 636a and 636b and the first and second drain electrodes 637a and 637b, thereby improving electrical characteristics of the thin film transistor 600.

Furthermore, in the current embodiment of the present invention, the data wiring 633 crossing the gate wiring 611 is spaced apart from the first conductive members 612, and does not overlap the first conductive members 612. As such, electrical characteristics of the thin film transistor 600 may be improved while reducing or minimizing an undesired electric capacity (e.g., capacitance) generated between the gate wiring 611 and the data wiring 633. In the thin film transistor 600 according to the current embodiment of the present invention, the data wiring 633 need not be formed.

Figure 24:
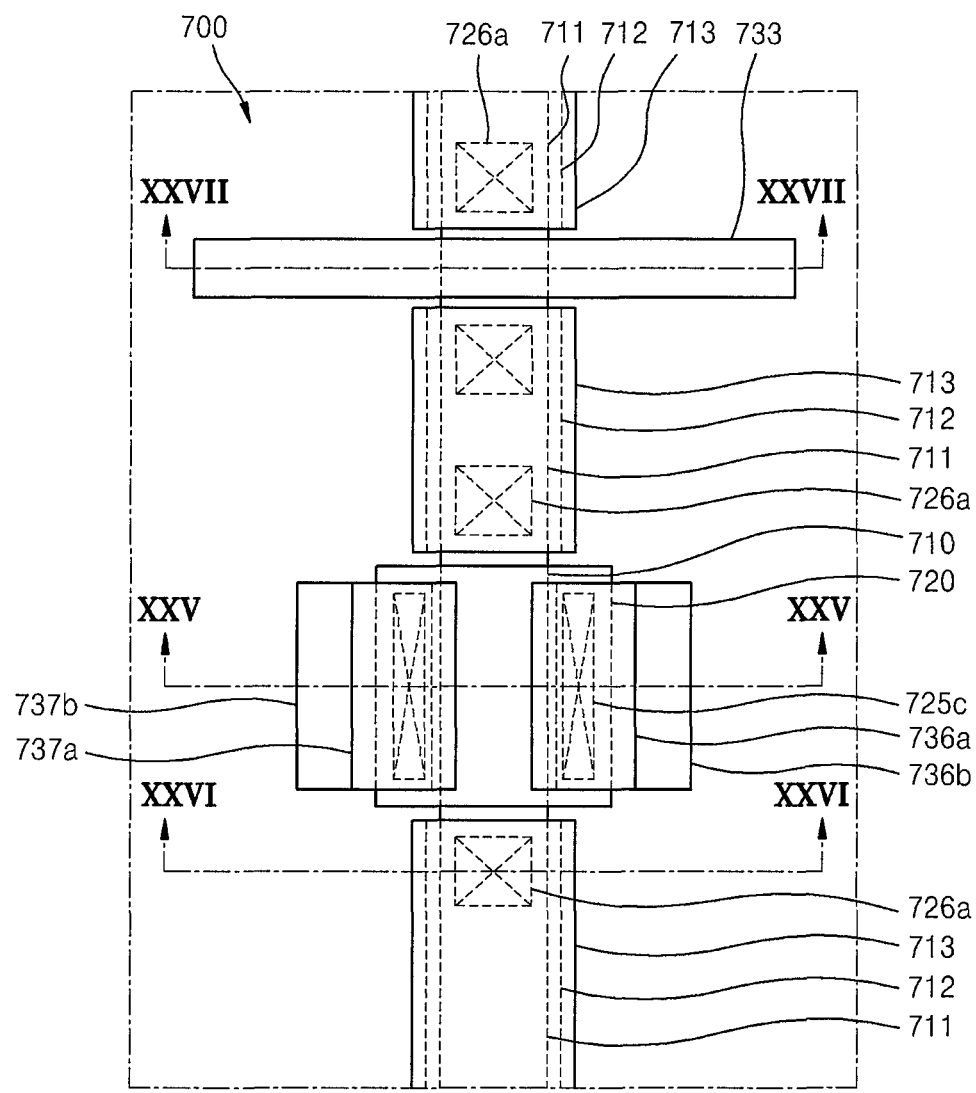
FIG. 24 is a plan view of a thin film transistor according to another embodiment of the present invention.
Figure 25:
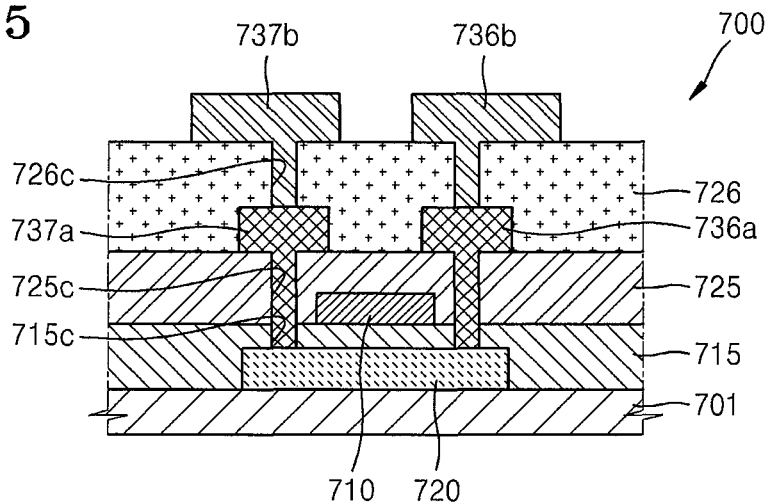
FIG. 25 is a cross-sectional view taken along the line XXV-XXV of FIG. 24.
Figure 26:
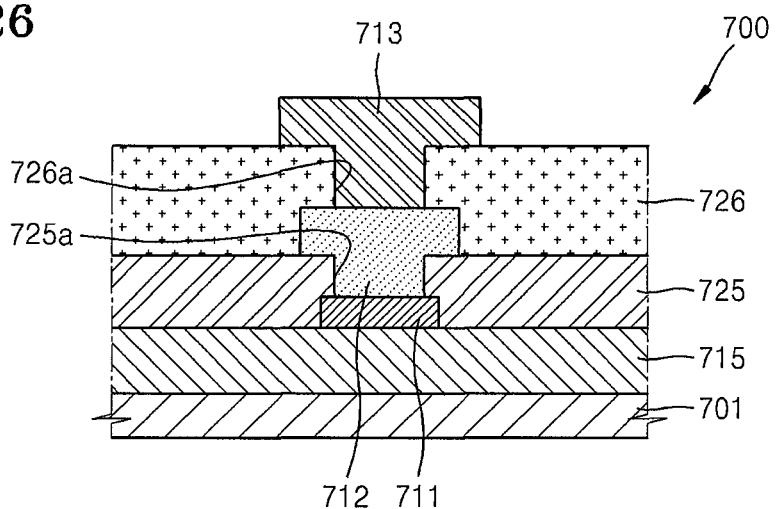
FIG. 26 is a cross-sectional view taken along the line XXVI-XXVI of FIG. 24.
Figure 27:
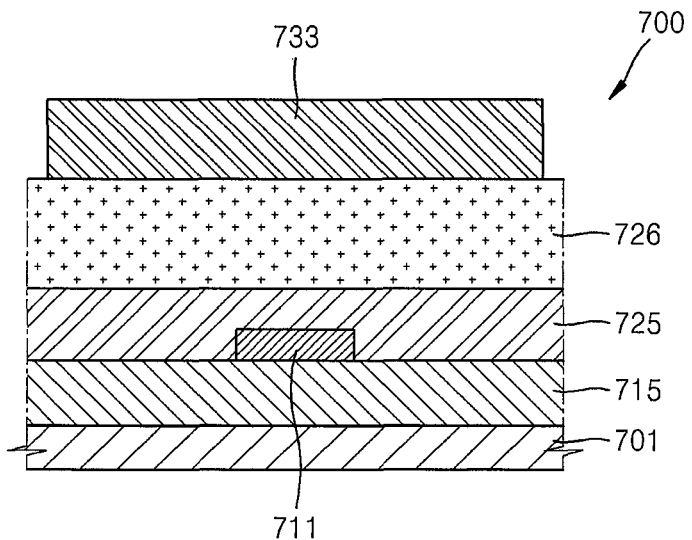
FIG. 27 is a cross-sectional view taken along the line XXVII-XXVII of FIG. 24.

FIG. 24 is a plan view of a thin film transistor 700 according to another embodiment of the present invention. FIG. 25 is a cross-sectional view taken along the line XXV-XXV of FIG. 24. FIG. 26 is a cross-sectional view taken along the line XXVI-XXVI of FIG. 24. FIG. 27 is a cross-sectional view taken along the line XXVII-XXVII of FIG. 24. For convenience of explanation, differences from the previous embodiments will be mainly described.

Referring to FIGS. 24 through 27, the thin film transistor 700 according to the current embodiment of the present invention includes a substrate 701, a gate electrode 710, an active layer 720, first and second source electrodes 736a and 736b, first and second drain electrodes 737a and 737b, a gate wiring 711, first conductive members 712, second conductive members 713, and a data wiring 733.

The active layer 720 is formed on the substrate 701. A buffer layer may be formed between the substrate 701 and the active layer 720. The active layer 720 includes various semiconductor materials, for example, a silicon-based inorganic semiconductor material, an organic semiconductor material, or an oxide semiconductor material.

The gate electrode 710 is formed on the active layer 720, and the gate electrode 710 and the active layer 720 are insulated from each other by a gate insulating layer 715.

The gate wiring 711 is electrically coupled to the gate electrode 710. For example, the gate electrode 710 and the gate wiring 711 may be integrally formed. An electrical signal may be applied to the gate electrode 710 via the gate wiring 711.

A first interlayer insulating layer 725 is formed on the gate electrode 710. In the present embodiment of the present invention, the first interlayer insulating layer 725 is also formed on the gate wiring 711. The first interlayer insulating layer 725 has first via holes 725a that overlap regions of an upper surface of the gate wiring 711.

The first conductive members 712 are formed on the first interlayer insulating layer 725. The first conductive members 712 are spaced apart from the active layer 720 and are coupled to the gate wiring 711. In more detail, the first conductive members 712 are formed to overlap the first via holes 725a of the first interlayer insulating layer 725, and the first conductive members 712 and the gate wiring 711 are coupled through the first via holes 725a.

The first source electrode 736a and the first drain electrode 737a are formed on the first interlayer insulating layer 725, and are electrically coupled to the active layer 720 through first contact holes 725c of the first interlayer insulating layer 725 and through contact holes 715c of the gate insulating layer 715.

A second interlayer insulating layer 726 is formed on the first interlayer insulating layer 725 to cover the first conductive members 712. Also, the second interlayer insulating layer 726 is formed on the first source electrode 736a and the first drain electrode 737a.

The second source electrode 736b and the second drain electrode 737b are formed to be respectively coupled to the first source electrode 736a and the first drain electrode 737a through second contact holes 726c of the second interlayer insulating layer 726.

The second conductive members 713 are formed on the second interlayer insulating layer 726. The second conductive members 713 are spaced apart from the active layer 720 and the gate electrode 710 and are electrically coupled to the first conductive members 712. In more detail, the second conductive members 713 are formed to overlap second via holes 726a of the second interlayer insulating layer 726, and the first conductive members 712 and the second conductive members 713 are electrically coupled to each other through the second via holes 726a. Also, the second conductive members 713 may be formed of the same material as the second source electrode 736b or the second drain electrode 737b.

The data wiring 733 is formed on the second interlayer insulating layer 726. The data wiring 733 is electrically coupled to, and may apply an electrical signal to, the first and second source electrodes 736a and 736b or the first and second drain electrodes 737a and 737b. The data wiring 733 is formed to cross the gate wiring 711.

Also, the data wiring 733 is formed to be spaced apart from the first conductive members 712 and the second conductive members 713. In more detail, as illustrated in FIG. 24, the data wiring 733 is formed to correspond to (e.g., formed above) a space between the first conductive members 712 and a space between the second conductive members 713. That is, the first conductive members 712 and the second conductive members 713 do not overlap the data wiring 733.

The first conductive members 712 of the thin film transistor 700 according to the current embodiment of the present invention are coupled to the gate wiring 711. As such, a resistance of the gate wiring 711 may be reduced. That is, because a voltage may be applied via the gate wiring 711 without increasing a width of the gate wiring 711, a display apparatus having a high resolution, a high aperture ratio, and a large size may be achieved by using the thin film transistor 700 according to the current embodiment of the present invention. Also, because the second conductive members 713 are coupled to the first conductive members 712, the resistance of the gate wiring 711 may be further reduced.

Further, the first conductive members 712 and the second conductive members 713 are spaced apart from, and do not overlap, the gate electrode 710. Because the first conductive members 712 and the second conductive members 713 do not overlap the gate electrode 710, and are coupled to only the gate wiring 711, a resistance of the gate wiring 711 may be reduced, and thus a resistance of the gate electrode 710 coupled to the gate wiring 711 may also be reduced, thereby improving electrical characteristics of the thin film transistor 700. Also, insulation characteristics between the gate electrode 710 and the active layer 720 may be maintained without increasing a thickness of the first insulating layer 715, and a short circuit between the gate electrode 710 and the first and second source electrodes 736a and 736b (or between the gate electrode 710 and the first and second drain electrodes 737a and 737b) may be prevented or avoided.

Also, in the current embodiment of the present invention, because the second source electrode 736b is coupled to the first source electrode 736a, and the second drain electrode 737b is coupled to the first drain electrode 737a, a resistance of the first and second source electrodes 736a and 736b and the first and second drain electrodes 737a and 737b may be reduced without increasing an overall width of the first and second source electrodes 736a and 736b and the first and second drain electrodes 737a and 737b, thereby improving electrical characteristics of the thin film transistor 700.

Furthermore, in the current embodiment of the present invention, the data wiring 733 crossing the gate wiring 711 is spaced apart from the first conductive members 712, and more particularly, does not overlap the first conductive members 712. As such, electrical characteristics of the thin film transistor 700 may be improved while reducing or minimizing an undesired electric capacity (e.g., capacitance) generated between the gate wiring 711 and the data wiring 733. In the thin film transistor 700 according to the current embodiment of the present invention, the data wiring 733 need not be formed.

Figure 28:
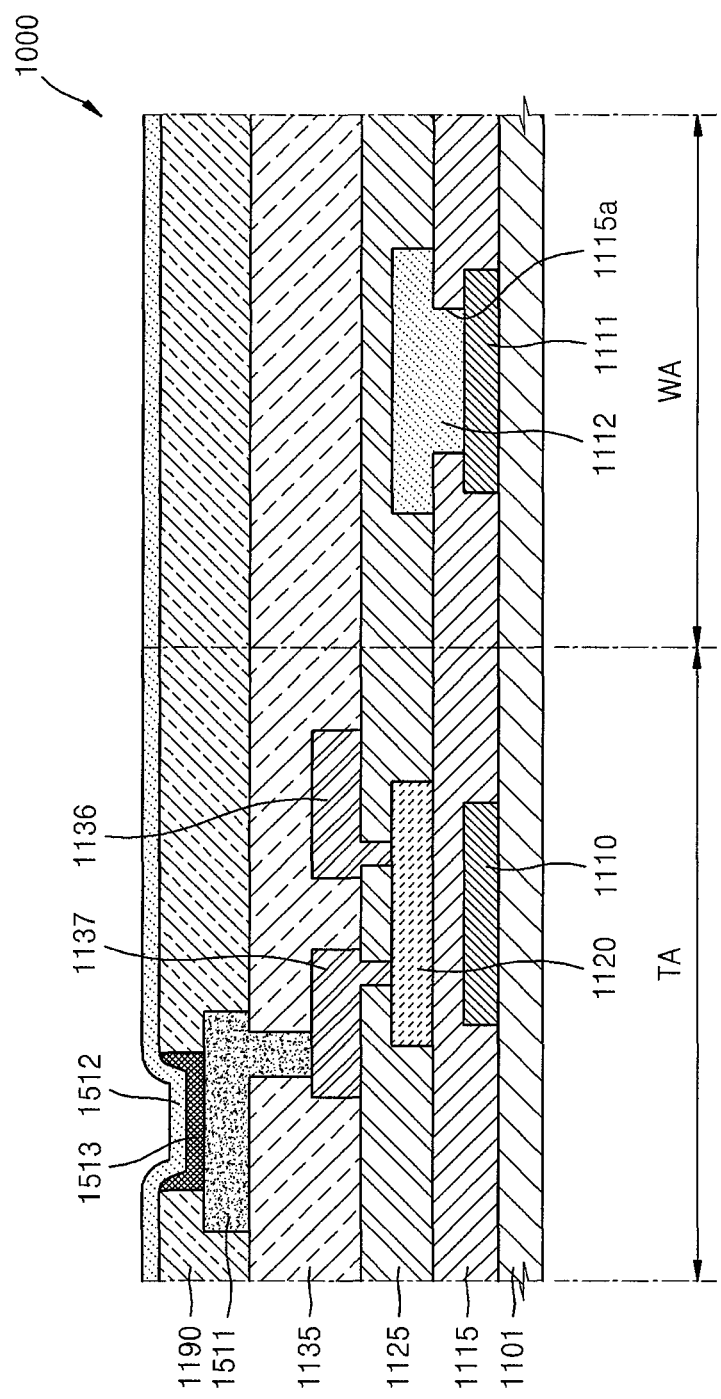
FIG. 28 is a cross-sectional view of an organic light-emitting display apparatus according to an embodiment of the present invention.

FIG. 28 is a cross-sectional view of an organic light-emitting display apparatus 1000 according to an embodiment of the present invention. In more detail, the organic light-emitting display apparatus 1000 according to the current embodiment of the present invention uses the thin film transistor 100 illustrated in FIG. 1. For convenience of explanation, differences from the previous embodiments will be mainly described.

Referring to FIG. 28, the organic light-emitting display apparatus 1000 according to the current embodiment of the present invention includes a substrate 1101, a gate electrode 1110, an active layer 1120, a source electrode 1136, a drain electrode 1137, a gate wiring 1111, and first conductive members 1112.

The substrate 1101 includes a display region TA and a wiring region WA. The display region TA includes a region for emitting light (e.g., visible light). For example, in the current embodiment of the present invention, an intermediate layer 1513, including an organic emission layer, is formed at the display region TA. The wiring region WA is a region where wirings are formed for applying various signals for light emission from the intermediate layer 1513, for example, a data signal or a scan signal.

The gate electrode 1110 is formed on the substrate 1101. Also, the gate wiring 1111 is formed at the wiring region WA of the substrate 1101, and is electrically coupled to the gate electrode 1110. For example, the gate electrode 1110 and the gate wiring 1111 may be integrally formed. An electrical signal (e.g., a scan signal) may be applied to the gate electrode 1110 via the gate wiring 1111.

A first insulating layer 1115 is formed on the gate electrode 1110. In the present embodiment of the present invention, the first insulating layer 1115 is also formed on the gate wiring 1111, and has first via holes 1115a, which are formed to overlap regions of an upper surface of the gate wiring 1111.

The active layer 1120 is formed on the first insulating layer 1115 to overlap the gate electrode 1110. The active layer 1120 includes various semiconductor materials, for example, a silicon-based inorganic semiconductor material, an organic semiconductor material, or an oxide semiconductor material. If the active layer 1120 includes an oxide semiconductor material, the active layer 1120 may include ZnO-based oxide, for example, a Ga—In—Zn—O-based material.

The first conductive members 1112 are formed on the first insulating layer 1115 spaced apart from the active layer 1120, electrically coupled to the gate wiring 1111, and corresponding to the wiring region WA of the substrate 1101. In more detail, the first conductive members 1112 overlap the first via holes 1115a of the first insulating layer 1115, and the first conductive members 1112 and the gate wiring 1111 are electrically coupled through the first via holes 1115a.

A second insulating layer 1125 is formed on the active layer 1120. The second insulating layer 1125 is formed to protect the active layer 1120, and more particularly, to protect a channel region of the active layer 1120. Also, the second insulating layer 1125 is formed to cover the first conductive members 1112.

The source electrode 1136 and the drain electrode 1137 are formed to be electrically coupled to the active layer 1120.

A passivation layer 1135 is formed on the source electrode 1136 and the drain electrode 1137.

A first electrode 1511 is formed on the passivation layer 1135. The passivation layer 1135 is formed to cover less than the entire drain electrode 1137, and to expose a region of the drain electrode 1137, and the first electrode 1511 is formed to be coupled to the exposed drain electrode 1137.

The first electrode 1511 may function as an anode, and a second electrode 1512 may function as a cathode, or vice versa. If the first electrode 1511 functions as an anode, the first electrode 1511 may include, for example, indium tin oxide (ITO), indium zinc oxide (IZO), ZnO, or $In_2O_3$ having a high work function. Also, the first electrode 1511 may further include a reflective layer formed of, for example, silver (Ag), magnesium (Mg), aluminum (Al), platinum (Pt), palladium (Pd), gold (Au), nickel (Ni), neodymium (Nd), iridium (Ir), chromium (Cr), lithium (Li), ytterbium (Yb), or calcium (Ca).

A pixel-defining layer 1190 is formed on the first electrode 1511 by using an insulator. In the present embodiment of the present invention, the pixel-defining layer 1190 is formed to expose at least a portion of an upper surface of the first electrode 1511, and the intermediate layer 1513 is formed on the exposed upper surface of the first electrode 1511. The intermediate layer 1513 includes the organic emission layer for emitting visible light, and may be formed as a low-molecular or high-molecular organic layer. If the intermediate layer 1513 is formed as a low-molecular organic layer, the intermediate layer 1513 may include, for example, a hole injection layer (HIL), a hole transporting layer (HTL), the organic emission layer, an electron transporting layer (ETL), and an electron injection layer (EIL).

The HIL may be formed of, for example, a phthalocyanine compound such as copper phthalocyanine, or a starburst-type amine such as 4,4',4"-tri(N-carbazolyl)triphenylamine (TCTA),
4,4',4"-tris(3-methylphenylamino)triphenylamine (m-MT-DATA), or
1,3,5-tris[4-(3-methylphenylphenylamino)phenyl]benzene (m-MTDAPB).

The HTL may be formed of, for example,
N,N'-bis(3-methylphenyl)-N,N'-diphenyl-[1,1-biphenyl]-4, 4'diamine (TPD) or
N,N'-di(naphthalene-1-yl)-N,N'-diphenyl benzidine ($\alpha$-NPD).

The EIL may be formed of, for example, LiF, NaCl, CsF, $Li_2O$, BaO, or Liq.

The ETL may be formed of, for example, Alq3.

The organic emission layer may include a host material and a dopant material.

The second electrode 1512 is formed on the intermediate layer 1513. If the second electrode 1512 functions as a cathode, the second electrode 1512 may be formed of metal such as Ag, Mg, Al, Pt, Pd, Au, Ni, Nd, Ir, Cr, Li, or Ca. Also, the second electrode 1512 may include, for example, ITO, IZO, ZnO, or $In_2O_3$ to transmit light.

An encapsulation member may be formed on the second electrode 1512, and may be formed of various materials. For example, the encapsulation member may be formed as a glass substrate. Alternatively, the encapsulation member may formed by using organic and inorganic layers, and the organic and inorganic layers may be alternately stacked.

The first conductive members 1112 of the organic light-emitting display apparatus 1000 according to the current embodiment of the present invention are coupled to the gate wiring 1111. As such, a resistance of the gate wiring 1111 may be reduced. That is, because a voltage may be applied via the gate wiring 1111 without increasing a width of the gate wiring 1111, the organic light-emitting display apparatus 1000 having a high resolution, a high aperture ratio, and a large size may be achieved.

Further, the first conductive members 1112 are spaced apart from, and do not overlap, the gate electrode 1110. Because the first conductive members 1112 do not overlap the gate electrode 1110, and are coupled to only the gate wiring 1111, a resistance of the gate wiring 1111 may be reduced, and thus a resistance of the gate electrode 1110 coupled to the gate wiring 1111 may also be reduced, thereby improving electrical characteristics of the organic light-emitting display apparatus 1000. Also, insulation characteristics between the gate electrode 1110 and the active layer 1120 may be maintained without increasing a thickness of the first insulating layer 1115, and a short circuit defect between the gate electrode 1110 and the source electrode 1136 (or between the gate electrode 1110 and the drain electrode 1137) may be prevented.

Figure 29:
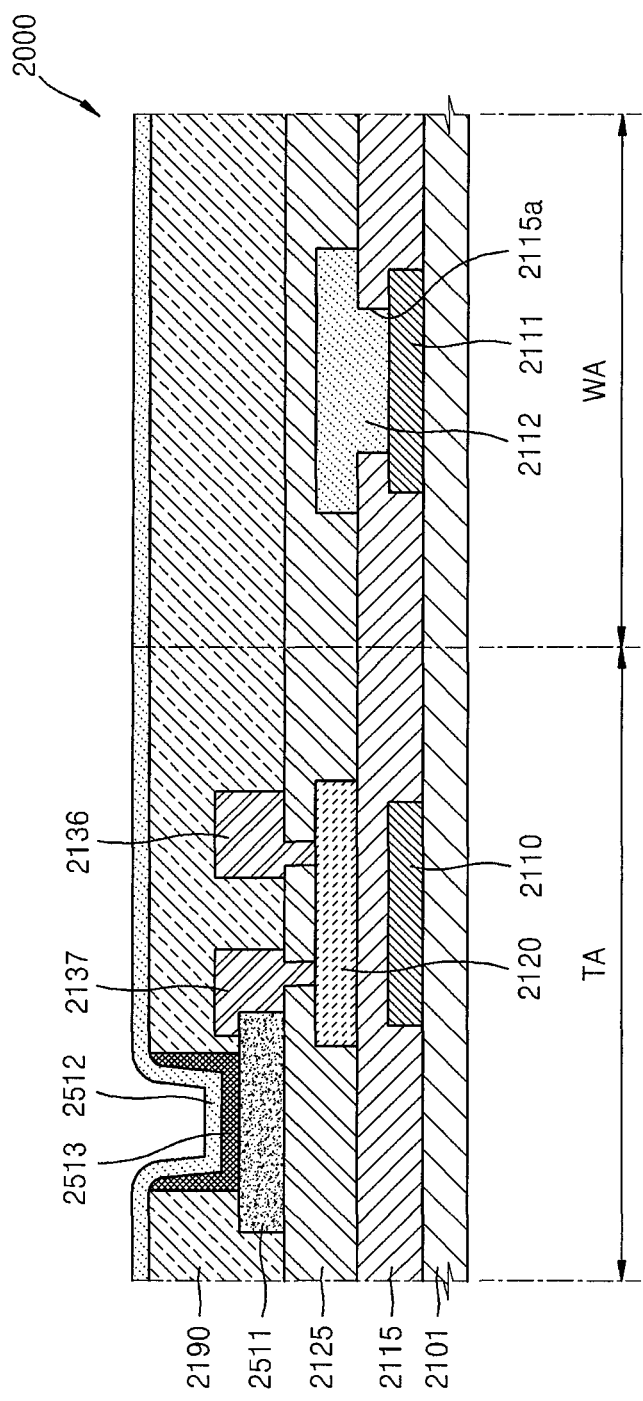
FIG. 29 is a cross-sectional view of an organic light-emitting display apparatus according to another embodiment of the present invention.

FIG. 29 is a cross-sectional view of an organic light-emitting display apparatus 2000 according to another embodiment of the present invention. In more detail, the organic light-emitting display apparatus 2000 according to the current embodiment of the present invention uses the thin film transistor 100 illustrated in FIG. 1. For convenience of explanation, differences from the previous embodiments will be mainly described.

Referring to FIG. 29, the organic light-emitting display apparatus 2000 according to the current embodiment of the present invention includes a substrate 2101, a gate electrode 2110, an active layer 2120, a source electrode 2136, a drain electrode 2137, a gate wiring 2111, and first conductive members 2112.

The substrate 2101 includes a display region TA and a wiring region WA.

The gate electrode 2110 is formed on the substrate 2101, and the gate wiring 2111 is formed at the wiring region WA of the substrate 2101. A first insulating layer 2115 is formed on the gate electrode 2110, and the active layer 2120 is formed on the first insulating layer 2115. The first conductive members 2112 are formed on the first insulating layer 2115 spaced apart from the active layer 2120, electrically coupled to the gate wiring 2111, and corresponding to the wiring region WA of the substrate 2101. A second insulating layer 2125 is formed on the active layer 2120. Structures of the gate electrode 2110, the gate wiring 2111, the first insulating layer 2115, the active layer 2120, the first conductive members 2112, and the second insulating layer 2125 are the same as those described above in the previous embodiments, and thus detailed descriptions thereof are not provided here.

A first electrode 2511 is formed on the second insulating layer 2125. After that, the source electrode 2136 and the drain electrode 2137 are formed to be coupled to active layer 2120. That is, the first electrode 2511 is formed from the same layer as the source electrode 2136 and the drain electrode 2137. As such, an overall thickness of the organic light-emitting display apparatus 2000 may be reduced and a manufacturing process may be simplified.

A pixel-defining layer 2190 is formed on the first electrode 2511 using an insulator. In the present embodiment of the present invention, the pixel-defining layer 2190 is formed to expose at least a portion of an upper surface of the first electrode 2511, and an intermediate layer 2513 is formed on the exposed upper surface of the first electrode 2511. The intermediate layer 2513 includes an organic emission layer for emitting visible light.

A second electrode 2512 is formed on the intermediate layer 2513, and an encapsulation member may be formed on the second electrode 2512.

The first conductive members 2112 of the organic light-emitting display apparatus 2000 according to the current embodiment of the present invention are coupled to the gate wiring 2111. As such, a resistance of the gate wiring 2111 may be reduced. That is, because a voltage may be applied via the gate wiring 2111 without increasing a width of the gate wiring 2111, the organic light-emitting display apparatus 2000 having a high resolution, a high aperture ratio, and a large size may be achieved.

Further, the first conductive members 2112 are spaced from, and do not overlap, the gate electrode 2110. Because the first conductive members 2112 do not overlap the gate electrode 2110 and are coupled to only the gate wiring 2111, a resistance of the gate wiring 2111 may be reduced, and thus a resistance of the gate electrode 2110 coupled to the gate wiring 2111 may also be reduced, thereby improving electrical characteristics of the organic light-emitting display apparatus 2000. Also, insulation characteristics between the gate electrode 2110 and the active layer 2120 may be maintained without increasing a thickness of the first insulating layer 2115, and a short circuit defect between the gate electrode 2110 and the source electrode 2136 (or the drain electrode 2137) may be prevented or avoided.

Furthermore, because the first electrode 2511 is formed from the same layer as the source electrode 2136 and the drain electrode 2137, a thickness of the organic light-emitting display apparatus 2000 may be reduced, and convenience of production may be increased.

Although the organic light-emitting display apparatuses 1000 and 2000 illustrated in FIGS. 28 and 29 are assumed for convenience of explanation to use the thin film transistor 100 illustrated in FIG. 1, the present invention is not limited thereto. That is, the organic light-emitting display apparatuses 1000 and 2000 may use one of the thin film transistors 200, 300, 400, 500, 600, or 700 respectively illustrated in FIG. 4, 8, 12, 16, 20, or 24.

According to embodiments of the present invention, a thin film transistor and an organic light-emitting display apparatus may improve image quality characteristics.

While embodiments of the present invention has been particularly shown and described with reference to exemplary embodiments thereof, it will be understood by those of ordinary skill in the art that various changes in form and details may be made therein without departing from the spirit and scope of the present invention as defined by the following claims, and their equivalents.

What is claimed is:

1. A thin film transistor comprising:
   a substrate;
   a gate electrode on the substrate;
   an active layer spaced from the gate electrode;
   a source electrode and a drain electrode spaced from the gate electrode and coupled to the active layer;
   a gate wiring at a same layer as the gate electrode and coupled to the gate electrode; and
   first conductive members electrically coupled to, and overlapping, the gate wiring, wherein the first conductive members comprise at least two first conductive members and the gate electrode is in between the two first conductive members.

2. The thin film transistor of claim 1, wherein the gate wiring and the gate electrode are integrally formed.

3. The thin film transistor of claim 1, wherein the first conductive members are spaced apart from, and do not overlap, the gate electrode, the active layer, the source electrode, and the drain electrode.

4. The thin film transistor of claim 1, wherein a first insulating layer having first via holes is between portions of the gate wiring and the first conductive members, and
   wherein the gate wiring and the first conductive members are coupled through the first via holes.

5. The thin film transistor of claim 1, wherein the active layer is on the gate electrode, and
   wherein the first conductive members are formed at a same layer as the active layer.

6. The thin film transistor of claim 1, wherein the active layer comprises an oxide semiconductor material.

7. The thin film transistor of claim 1, further comprising a data wiring electrically coupled to the source electrode or to the drain electrode,
   wherein the data wiring crosses the gate wiring and is spaced apart from the first conductive members.

8. The thin film transistor of claim 7, wherein the first conductive members do not overlap the data wiring.

9. The thin film transistor of claim 1, further comprising second conductive members electrically coupled to, and overlapping, respective ones of the first conductive members.

10. The thin film transistor of claim 9, wherein the second conductive members are spaced apart from, and do not overlap, the gate electrode, the active layer, the source electrode, and the drain electrode.

11. The thin film transistor of claim 9, further comprising a second insulating layer that has second via holes and is located between portions of the first conductive members and of the second conductive members, and
   wherein respective ones of the first conductive members and the second conductive members are coupled through the second via holes.

12. The thin film transistor of claim 9, wherein the second conductive members overlap the gate wiring.

13. The thin film transistor of claim 1, wherein the gate electrode is on the active layer, and
   wherein the source electrode and the drain electrode are on the gate electrode.

14. The thin film transistor of claim 13, further comprising a first interlayer insulating layer and a second interlayer insulating layer stacked between the gate electrode and the source electrode, and between the gate electrode and the drain electrode.

15. The thin film transistor of claim 14, wherein the first interlayer insulating layer has first via holes, and
   wherein the first conductive members are coupled to the gate wiring through the first via holes.

16. The thin film transistor of claim 14, wherein the second interlayer insulating layer has second via holes, and
   wherein the thin film transistor further comprises second conductive members coupled to the first conductive members through the second via holes.

17. A thin film transistor comprising:
   a substrate;
   a gate electrode on the substrate;
   an active layer spaced from the gate electrode and entirely above a surface of the gate electrode facing the active layer;
   a source electrode and a drain electrode spaced from the gate electrode and coupled to the active layer;
   a gate wiring at a same layer as the gate electrode and coupled to the gate electrode;
   first conductive members electrically coupled to, and overlapping, the gate wiring; and
   a first interlayer insulating layer and a second interlayer insulating layer stacked between the gate electrode and the source electrode, and between the gate electrode and the drain electrode,
   wherein the source electrode comprises a first source electrode and a second source electrode,
   wherein the drain electrode comprises a first drain electrode and a second drain electrode,
   wherein the first interlayer insulating layer has first contact holes,
   wherein the second interlayer insulating layer has second contact holes,
   wherein the first source electrode and the first drain electrode are electrically coupled to the active layer through the first contact holes, and
   wherein the second source electrode and the second drain electrode are respectively coupled to the first source electrode and the first drain electrode through the second contact holes.

18. An organic light-emitting display apparatus comprising:
   a substrate;
   a gate electrode on the substrate;
   an active layer spaced apart from the gate electrode;

a source electrode and a drain electrode spaced apart from the gate electrode and coupled to the active layer;

a gate wiring at a same layer as the gate electrode and coupled to the gate electrode;

first conductive members electrically coupled to, and overlapping, the gate wiring;

a first electrode electrically coupled to the source electrode or to the drain electrode;

an intermediate layer on the first electrode and comprising an organic emission layer; and a second electrode on the intermediate layer.

19. The organic light-emitting display apparatus of claim 18, wherein one or more insulating layers are between the source electrode and the first electrode, and between the drain electrode and the first electrode.

20. The organic light-emitting display apparatus of claim 18, wherein the first electrode is formed at a same layer as the source electrode and the drain electrode.

21. The organic light-emitting display apparatus of claim 18, wherein the source electrode and the drain electrode are formed after the first electrode is formed.

* * * * *